(12) United States Patent
Ohuchi et al.

(10) Patent No.: US 7,405,138 B2
(45) Date of Patent: Jul. 29, 2008

(54) MANUFACTURING METHOD OF STACK-TYPE SEMICONDUCTOR DEVICE

(75) Inventors: Shinji Ohuchi, Tokyo (JP); Yasushi Shiraishi, Tokyo (JP); Yasuo Tanaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 301 days.

(21) Appl. No.: 11/235,354

(22) Filed: Sep. 27, 2005

(65) Prior Publication Data

US 2006/0046436 A1     Mar. 2, 2006

Related U.S. Application Data

(62) Division of application No. 09/852,847, filed on May 11, 2001, now Pat. No. 7,019,397.

(30) Foreign Application Priority Data

Sep. 11, 2000   (JP)   ............... 2000-274813

(51) Int. Cl.
 *H01L 21/00*   (2006.01)
(52) U.S. Cl. ............. 438/462; 438/33; 438/68; 438/113; 257/528; 257/618; 257/622
(58) Field of Classification Search ........... 438/465, 438/460, 462, 114, 127, 110, 759; 257/528, 257/618, 622
See application file for complete search history.

(56) References Cited

U.S. PATENT DOCUMENTS

| | | |
|---|---|---|
| 5,281,852 A | 1/1994 | Normington |
| 5,313,096 A | 5/1994 | Eide |
| 5,448,511 A | 9/1995 | Paurus et al. |
| 5,508,562 A | 4/1996 | Horie et al. |
| 5,744,827 A | 4/1998 | Jeong et al. |
| 5,801,439 A | 9/1998 | Fujisawa et al. |
| 5,895,970 A | 4/1999 | Miyoshi |
| 5,903,049 A | 5/1999 | Mori |
| 5,986,209 A | 11/1999 | Tandy |
| 5,994,772 A | 11/1999 | Shin |
| 5,995,379 A | 11/1999 | Kyougoku et al. |
| 6,020,629 A | 2/2000 | Farnworth et al. |
| 6,025,648 A | 2/2000 | Takahashi et al. |
| 6,028,358 A | 2/2000 | Suzuki |

(Continued)

FOREIGN PATENT DOCUMENTS

JP     10-261753     8/1998

*Primary Examiner*—W. David Coleman
*Assistant Examiner*—Su C Kim
(74) *Attorney, Agent, or Firm*—Volentine & Whitt, P.L.L.C.

(57) ABSTRACT

A semiconductor device capable mounting semiconductor elements having different functions without increasing the area of the semiconductor device, and its manufacturing method are presented. A part if wiring 104 is formed al so at the side surface of a semiconducter element 101, and bump electrodes 102 formed so as to be nearly on a same plane as the wiring 104 formed at the side surface of the semiconducter element 101, at least a part of ball electrodes 103 is formed so as to connect electrically to the wiring 104 at the side surface of the semiconductor element, the side surface of the semiconductor element is sealed with resin exposing the wiring 104, and the confronting surface of the circuit forming surface is sealed with resin.

9 Claims, 20 Drawing Sheets

U.S. PATENT DOCUMENTS

| | | |
|---|---|---|
| 6,028,365 A | 2/2000 | Akram et al. |
| RE36,613 E | 3/2000 | Ball |
| 6,072,233 A | 6/2000 | Corisis et al. |
| 6,100,594 A | 8/2000 | Fukui et al. |
| 6,104,088 A | 8/2000 | Hatano et al. |
| 6,107,164 A * | 8/2000 | Ohuchi ................ 438/465 |
| 6,215,182 B1 | 4/2001 | Ozawa et al. |
| 6,303,872 B1 | 10/2001 | Jairazbhoy et al. |
| 6,303,997 B1 | 10/2001 | Lee |
| 6,339,255 B1 | 1/2002 | Shin |
| 6,376,769 B1 | 4/2002 | Chung |
| 6,379,999 B1 * | 4/2002 | Tanabe ................ 438/113 |
| 6,410,406 B1 * | 6/2002 | Farnworth et al. ....... 438/462 |
| 6,486,544 B1 | 11/2002 | Hasimoto |
| 6,501,663 B1 | 12/2002 | Pan |
| 6,562,647 B2 * | 5/2003 | Zandman et al. .......... 438/33 |
| 6,576,971 B2 | 6/2003 | Kimoto et al. |
| 2001/0000053 A1 | 3/2001 | Suh et al. |
| 2001/0048151 A1 | 12/2001 | Chun |
| 2002/0089043 A1 | 7/2002 | Park et al. |
| 2002/0190396 A1 | 12/2002 | Brand |

* cited by examiner

FORMING OF GROOVE

FORMING OF INSULATING LAYER

FORMING OF METAL FILM

FORMING OF RE-WIRING

FORMING OF Cu POST

REMOVAL OF EXPOSED METAL FILM

SEALING WITH RESIN
↓

POLISHING OF SURFACE
↓

POLISHING OF BACK SIDE
↓

SEALING OF BACK SIDE

FORMING OF TERMINAL

FORMING OF TERMINAL

DICING

EXPANDING

REFLOW

SEALING WITH RESIN
↓

POLISHING OF SURFACE
↓

POLISHING OF BACK SIDE
↓

SEALING OF BACK SIDE

EXPOSURE OF BACK SIDE RE-WIRING

FORMING OF TERMINAL

FORMING OF TERMINAL

DICING

EXPANDING

REFLOW

FORMING OF INTERLAYER FILM

FORMING OF METAL FILM

FORMING OF RE-WIRING

FORMING OF Cu POST

REMOVAL OF UNNECESSARY METAL FILM

FORMING OF Cu POST

SEALING WITH RESIN

↓

POLISHING OF SURFACE

↓

FORMING OF TERMINAL

↓

DICING

MANUFACTURING METHOD OF STACK-TYPE SEMICONDUCTOR DEVICE

CROSS REFERENCE TO RELATED APPLICATIONS

This is a divisional application of application Ser. No. 09/852,847, filed May 11, 2001, now U.S. Pat. No. 7,019,397, which is hereby incorporated by reference in its entirety for all purposes.

BACKGROUND OF THE INVENTION

The present invention relates to semiconductor device, manufacturing method of semiconductor device, stack type semiconductor device, and manufacturing method of stack type semiconductor device.

PRIOR ART

Recently, owing to rapid progress in portable electronic appliances, resin sealed type semiconductor devices mounted on portable appliances are required to be thinner, smaller and lighter. To meet such needs, semiconductor devices for high density mounting called chip size packages are being developed.

The structure of a chip size package is explained by referring to FIG. 21 and FIG. 22. FIG. 21 is a sectional diagram showing a structure of a conventional semiconductor device. FIG. 22 is a top view showing the structure of the conventional semiconductor device.

In a conventional semiconductor device, as shown in FIG. 21 and FIG. 22, electrode pads 606 made of, for example, Al electrodes are formed on a semiconductor element 601, and Cu re-wirings 604 are formed so as to be connected electrically to the electrode pads 606. The Cu re-wirings 604 are electrically connected to Cu posts (bump electrodes) 602 of a height of, for example, about 100 μm. The semiconductor element 601 and Cu posts 602 are sealed by a resin 605, and the surface of the Cu posts 602 is exposed. On the exposed surface of the Cu posts 602, solder balls 603 and other metal electrodes (ball electrodes) are formed.

A manufacturing method of such conventional semiconductor device is explained by referring to FIGS. 23(a)-23(e) and FIGS. 24(a) and 24(e). FIGS. 23(a)-23(e) are process sectional views showing a manufacturing method of the conventional semiconductor device. FIGS. 24(a)-24(e) are process sectional views showing the manufacturing method of the conventional semiconductor device.

First, as shown in FIG. 23(a), an electrode pad 606 is formed on a semiconductor element 601, and an oxide film 613 and an insulating layer 610 are formed on the semiconductor element 601 including the electrode pad 606. By specified etching method, the oxide film 613 and insulating layer 610 on the electrode pad 606 are removed, and an opening 614 is formed.

Further, as shown in FIG. 23(b), a metal film 612 is formed on the entire surface of the insulating layer 610 including the opening 614 of the electrode pad 606. Then, as shown in FIG. 23(c), for example, a Cu re-wiring 604 is formed on the metal film 612. Next, as shown in FIG. 23(d), a Cu post 602 is formed at the specified position on the Cu re-wiring 604 formed on the insulating layer 610. Later, an unnecessary metal film 612 is removed as shown in FIG. 23(e).

The Cu post 602 is thus formed, and as shown in FIG. 24(a), plural Cu posts 602 are formed at specified intervals on the semiconductor element 601.

Further, as shown in FIG. 24(b), the entire surface of the Cu posts 602 formed on the semiconductor element 601 is covered and sealed with a resin 605. The surface of the resin 605 is polished by an abrasive 607 as shown in FIG. 24(c), and the surface of the Cu posts 602 is exposed.

As shown in FIG. 24(d), solder balls 603 are formed on the exposed surface of the Cu posts 602, and terminals are formed. Further, as shown in FIG. 24(e), the semiconductor wafer is cut by a cutter 608 along a cutting line 609, and separated into individual pieces.

Thus, in the prior art, the semiconductor wafer forming plural semiconductor elements 601 is processed in the wafer state, and the semiconductor wafer is cut into individual pieces by dicing, so that plural semiconductor devices are manufactured. The semiconductor device manufactured in this manner is extremely similar to the semiconductor element 601 in size.

To realize high density mounting in such conventional semiconductor devices, as shown in FIG. 25, plural semiconductor devices are mounted on a same plane as other semiconductor device. One of the reasons of mounting plural semiconductor devices is that different functions cannot be formed on one semiconductor element. That is, for example, semiconductor elements of memory process and logic process are different in the manufacturing process of each semiconductor device, and therefore, generally, semiconductor elements are individually manufactured and mounted on other semiconductor substrates.

Hitherto, however, since plural semiconductor devices are mounted on a same plane of other semiconductor device, as the number of semiconductor devices being mounted increases, the area of the semiconductor devices mounted with high density increases. For example, as shown in FIG. 25, when two semiconductor devices are mounted on a same plane of other semiconductor device, the area for two semiconductor devices being mounted is required.

SUMMARY OF THE INVENTION

It is hence an object of the invention to solve the problems of the prior art, and present a novel and improved semiconductor device capable of mounting semiconductor devices of different functions without increasing the area, and a method of manufacturing the same.

To solve the problems, the invention presents a semiconductor device comprising a semiconductor element having plural electrodes on a circuit forming surface, a wiring formed at least on the circuit forming surface, having one end connected to the electrodes, a bump electrode connected to the wiring, a sealing resin for exposing the surface of the bump electrode and sealing the circuit forming surface of the semiconductor element, and a ball electrode formed on the surface of the bump electrode exposed from the resin, in which a part of the wiring is formed also at the side surface of the semiconductor element, and the bump electrode is formed so that the side surface of the bump electrode may be nearly flush with the wiring formed at the side surface of the semiconductor element, at least a part of the ball electrode is formed so as to be electrically connected to the wiring at the side surface of the semiconductor element, and the side surface of the semiconductor element is sealed with resin exposing the wiring, and the confronting surface of the circuit forming surface is sealed with resin on the entire surface including the end surface of the wiring formed at the side surface of the semiconductor element.

According to the invention, in the semiconductor device, a part of the wiring is formed at the side surface of the semiconductor element, and the bump electrodes are formed nearly on the same plane as the wiring, and the back side of the semiconductor device is sealed with resin. As a result, across the resin (for example, a thickness of about 50 μm) formed on the back side of the semiconductor element, plural semiconductor devices can be mounted in a longitudinal profile by electrically connecting to the other semiconductor device through the solder balls by way of the wiring and bump electrodes used as electrode terminals. Thus, plural semiconductor devices are mounted in a longitudinal profile, and the mounting density of semiconductor devices can be heightened.

Also to solve the problems, the invention further presents a manufacturing method of semiconductor device comprising a step of a nearly concave groove of a specified depth in the boundary region of a circuit forming surface of semiconductor elements, in a semiconductor wafer having a region for plural semiconductor elements forming specified circuits, a step of forming an insulating layer in a specified region of the side surface of the nearly concave groove and circuit forming surface, a step of forming a wiring in a specified region of the circuit forming surface including the entire surface of the inside of the nearly concave groove, a step of forming a bump electrode of a specified height on a boundary region including the inside of the nearly concave groove forming the wiring, a step of sealing the circuit forming surface with a resin exposing the surface of the bump electrode, a step of polishing a confronting surface of the circuit forming surface of the semiconductor wafer and exposing the nearly concave groove from the confronting surface, a step of sealing the entire confronting surface of the circuit forming surface of the semiconductor wafer with resin, including the end portion of the wiring formed at the exposed side surface of the nearly concave groove, a step of forming a ball electrode on the bump electrode, a step of cutting the semiconductor wafer along the exposed nearly concave groove, and forming plural semiconductor devices at the side surface thereof exposing the ball electrode, bump electrode and wiring, and a step of heating the divided semiconductor devices at specified temperature, and forming a part of the ball electrode formed on the bump electrode on the wiring at the side surface of the semiconductor element.

According to the invention, in the semiconductor device, a part of the wiring is formed at the side surface of the semiconductor element, and the bump electrodes are formed nearly on the same plane as the wiring, and the back side of the semiconductor device is sealed with resin. As a result, across the resin (for example, a thickness of about 50 μm) formed on the back side of the semiconductor element, plural semiconductor devices can be mounted in a longitudinal profile by electrically connecting to the other semiconductor device through the solder balls by way of the wiring and bump electrodes used as electrode terminals. Thus, plural semiconductor devices are mounted in a longitudinal profile, and the mounting density of semiconductor devices can be heightened.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

Figure 1:
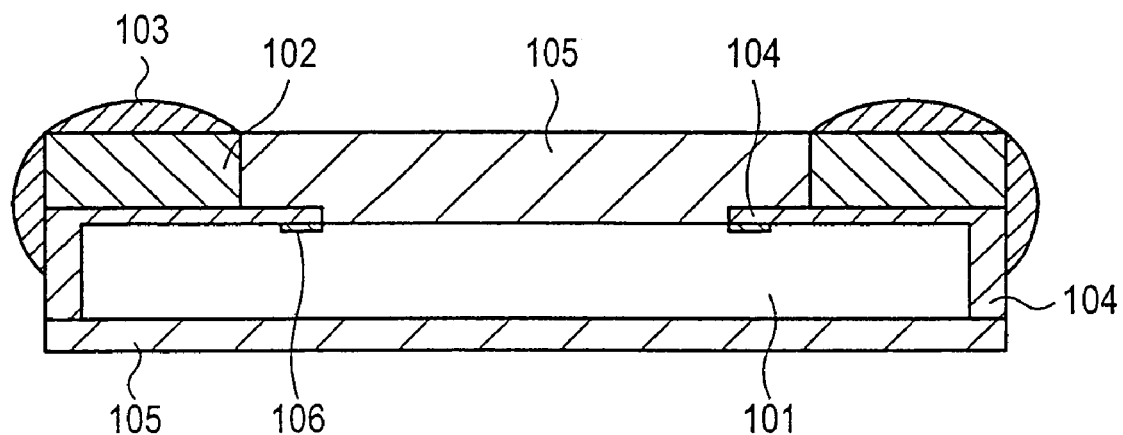
FIG. 1 is a sectional view showing a structure of a semiconductor element in a first embodiment.

Preferred embodiments of the invention are described in detail below while referring to the accompanying drawings. In the following explanation and accompanying drawings, constituent elements having same function and same structure are identified with same reference numerals, and duplicate explanation is omitted.

First Embodiment

Figure 2:
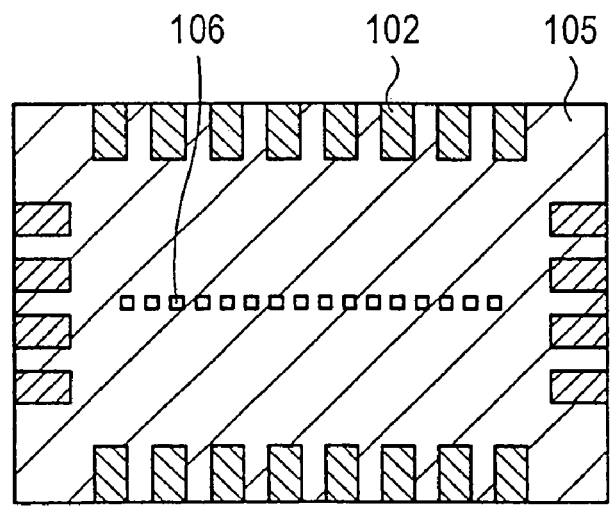
FIG. 2 is a top view showing the structure of the semiconductor element in the first embodiment.

Referring now to FIG. 1 to FIG. 10, a first embodiment is explained. FIG. 1 is a sectional view showing a structure of a semiconductor element in this embodiment. FIG. 2 is a top view showing the structure of the semiconductor element in this embodiment.

As shown in FIG. 1 and FIG. 2, in the semiconductor device of the embodiment, electrode pads 106 made of, for example, Al electrodes are formed on a circuit forming surface (upper side in the drawing) of a semiconductor element 101, and, for example, a Cu wiring (re-wiring hereinafter) 104 is formed so as to be connected electrically to the electrode pads 106. Further, the Cu re-wiring 104 is connected electrically to Cu posts (bump electrodes) 102 of a height of, for example, about 100 μm. The circuit forming surface of the semiconductor element 101 is sealed by a resin 105 exposing the surface of the Cu posts 102. On the exposed surface of the Cu posts 102, for example, metal electrodes (ball electrodes) such as solder ball 103 are formed. On the confronting surface (back side) of the semiconductor element 101, on the other hand, the entire surface including the end portion of the Cu re-wiring 104 formed at the side surface is sealed with resin.

Figure 3:
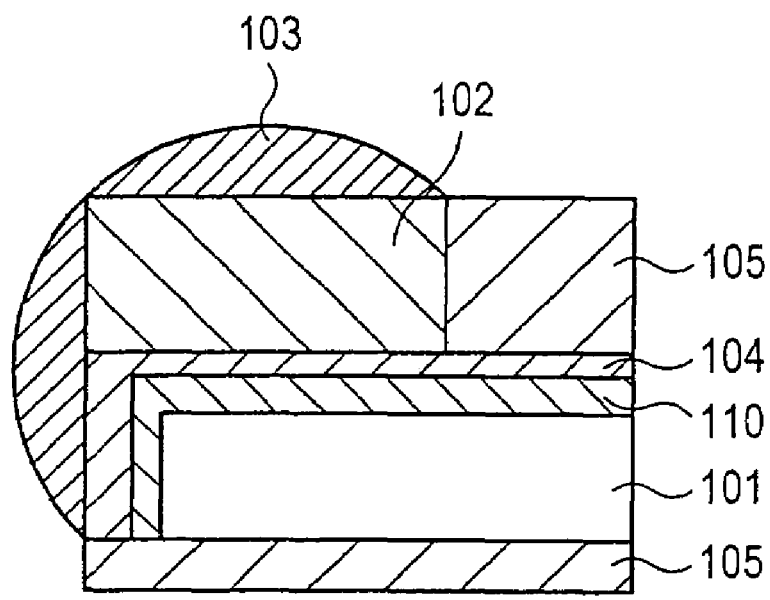
FIG. 3 is a magnified view showing the detail of the terminal area of the semiconductor element in the first embodiment.
Figure 4:
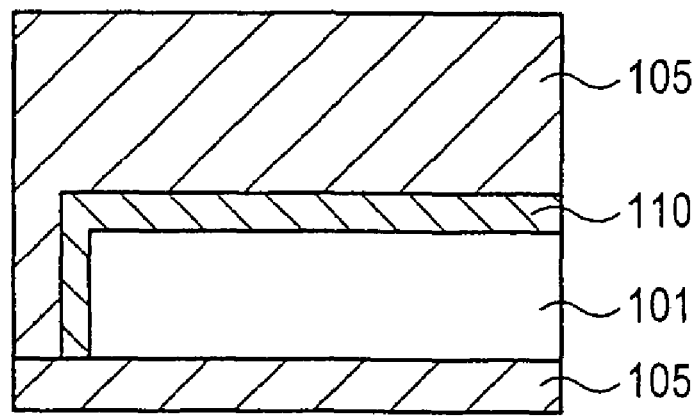
FIG. 4 is a magnified view showing the detail of the terminal non-forming area of the semiconductor element in the first embodiment.

The electrode terminal portion of the semiconductor device of the embodiment is explained by referring to FIG. 3 and FIG. 4. FIG. 3 is a magnified view showing the detail of the terminal area of the semiconductor device of the embodiment. FIG. 4 is a magnified view showing the detail of the terminal non-forming area of the semiconductor device of the embodiment.

In the forming area of electrode terminals, as shown in FIG. 3, an insulating layer 110 is formed on the circuit forming surface and side surface of the semiconductor element 101, and the re-wiring 104 is formed on this insulating layer 110. Further, Cu posts 102 are formed on the re-wiring 104 at the end portion (side surface) of the semiconductor element 101, and the re-wiring 104 up to the Cu posts 102 is sealed with the resin 105. The confronting surface (back side) of the circuit forming surface of the semiconductor element 101 is sealed with the resin 105 up to the Cu re-wiring 104 formed at the side surface of the semiconductor element 101.

On the other hand, in the non-forming area of electrode terminals, as shown in FIG. 4. An insulating layer 110 is formed on the circuit forming surface and side surface of the semiconductor element 101, and this insulating layer 110 is sealed with the resin 105. The entire surface of the confronting surface (back side) of the circuit forming surface of the semiconductor element 101 is sealed with the resin 105.

In this embodiment, a part of the re-wiring 104 is formed at the side surface of the semiconductor element 101, while the back side of the semiconductor element 101 is sealed with the resin. Thus, the electrode terminal portion can be easily connected to the electrodes of other semiconductor devices across the resin 105 (for example, a thickness of about 50 μm) at the back side of the semiconductor element 101. As a result, plural semiconductor devices can be connected in a longitudinal profile, so that a stack type semiconductor device of high density mounting is realized without increasing the area.

The manufacturing process of the semiconductor device of the embodiment is explained by referring to FIG. 5. FIG. 5 is a flowchart showing the manufacturing process of the semiconductor device in this embodiment.

Figure 5A:
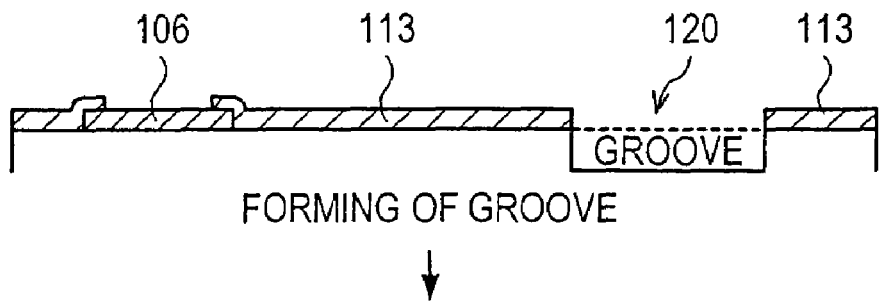
FIGS. 5(a)-5(f) are a flowchart showing the manufacturing process of the semiconductor element in the first embodiment.

First, as shown in FIG. 5(a), after forming an electrode pad 106 and an oxide film 113 on a semiconductor wafer 101 forming circuits, the oxide film 113 on the electrode pad 106 is removed by specified etching method. Further, as a boundary region for cutting off the semiconductor wafer, a nearly concave groove 120 of, for example, about tens of microns in depth is formed.

Figure 5B:
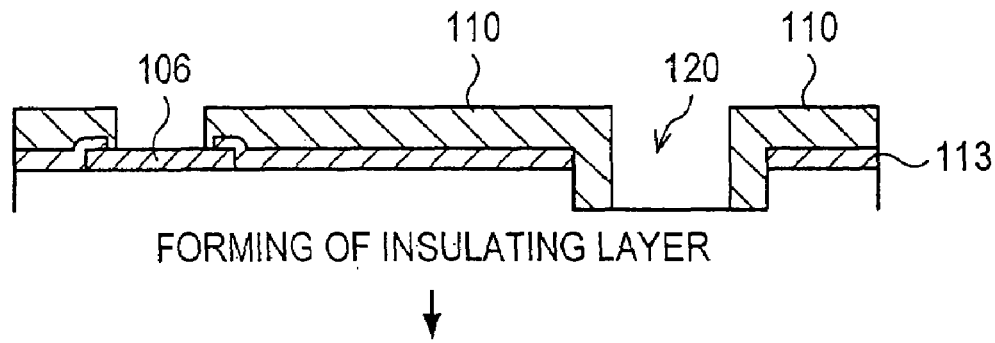

Next, as shown in FIG. 5(b), an insulating layer 110 of about several microns, for example, is formed in a region other than the electrode pads 120 and bottom of nearly concave groove 120. In the nearly concave groove 120, the insulating layer 110 is formed only on the side surface. As the material for the insulating layer, for example, polyimide or other resin may be used.

Figure 5C:
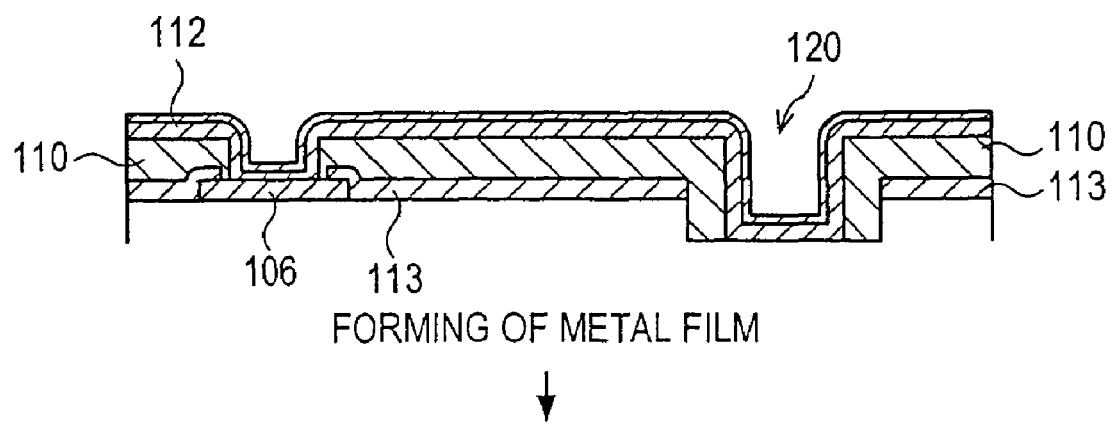
Figure 5D:
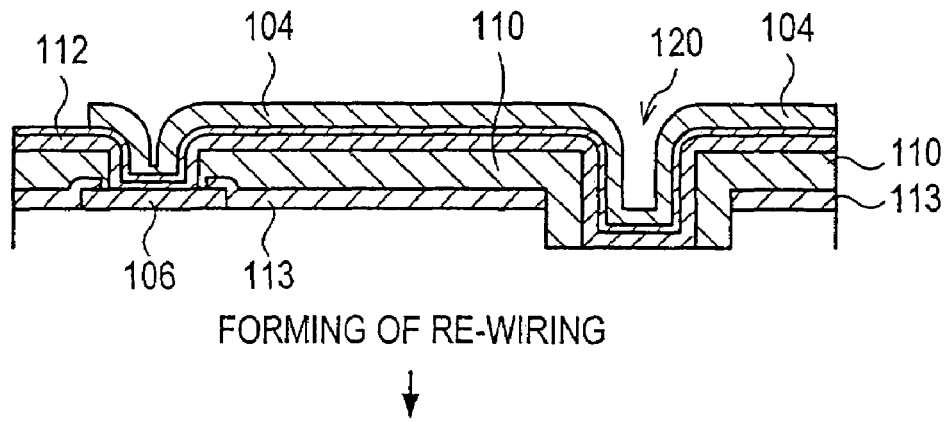

Further, as shown in FIG. 5(c), after forming a metal film 112 on the entire surface of the semiconductor wafer, a re-wiring 104 is formed as shown in FIG. 5(d). The metal film 112 and re-wiring 104 are also formed on the entire inner surface of the nearly concave groove 120.

Figure 5E:
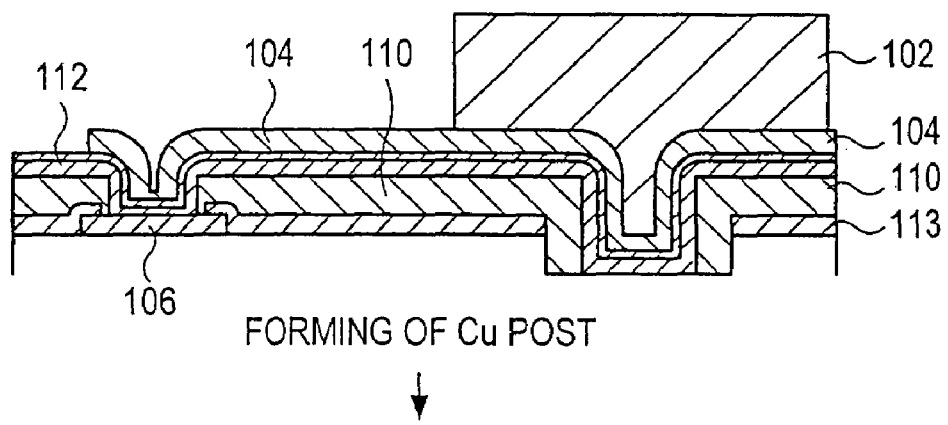
Figure 5F:
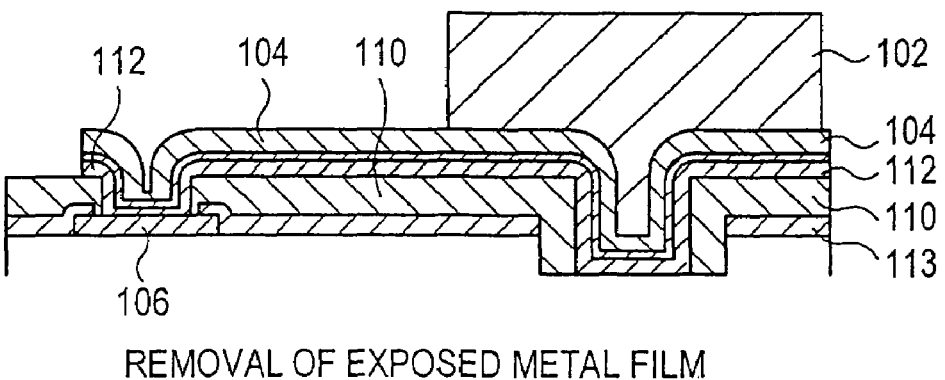

Then, as shown in FIG. 5(e), a Cu post 102 is formed so as to bury the nearly concave groove 120 and connect to the re-wiring 104 formed in the specified region on the circuit forming surface around the nearly concave groove. Later, as shown in FIG. 5(f), unnecessary metal film 112 and re-wiring 104 are removed.

Figure 6A:
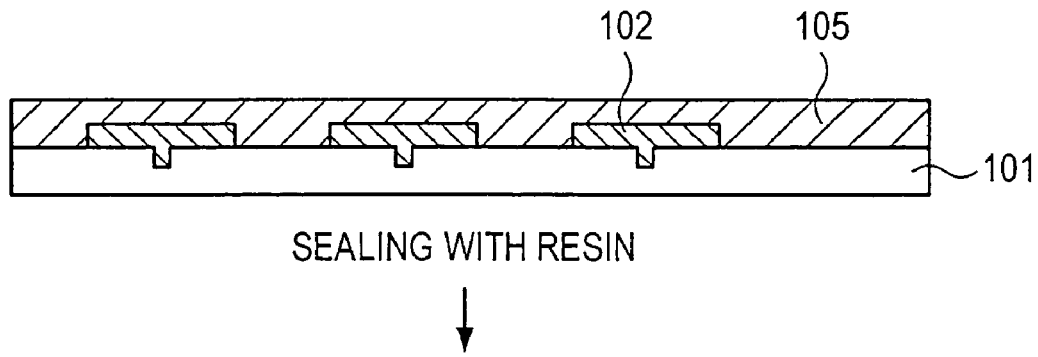
FIGS. 6(a)-6(f) are a flowchart showing the manufacturing process of the semiconductor element in the first embodiment.
Figure 6B:
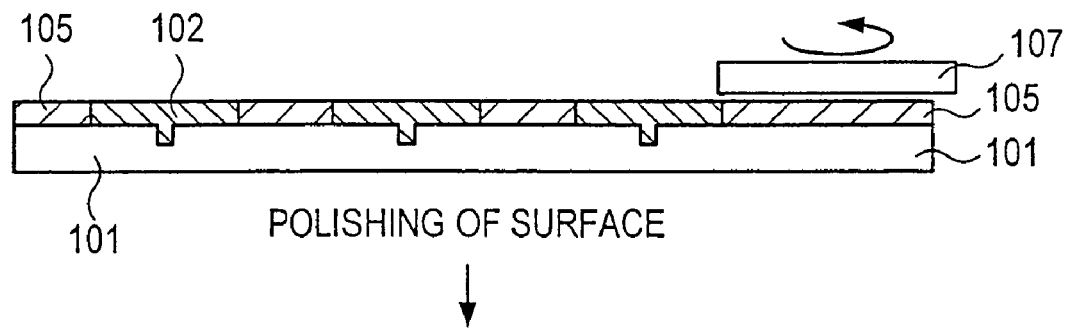

As shown in FIG. 6(a), the circuit forming surface of the semiconductor element 101 is sealed with the resin 105 so that it may be at least higher than the Cu post 102. As shown in FIG. 6(b), a polisher 107 polishes the resin 105 formed on the circuit forming surface of the semiconductor element 101, the surface of the Cu post 102 is exposed.

Figure 6C:
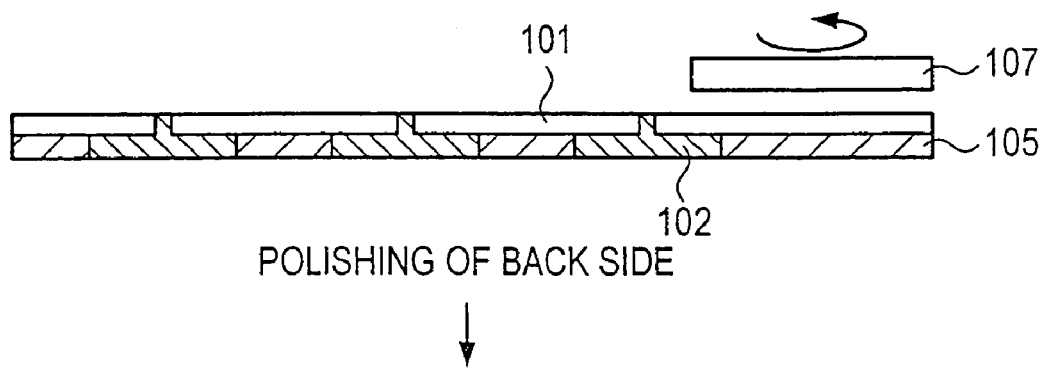
Figure 6D:
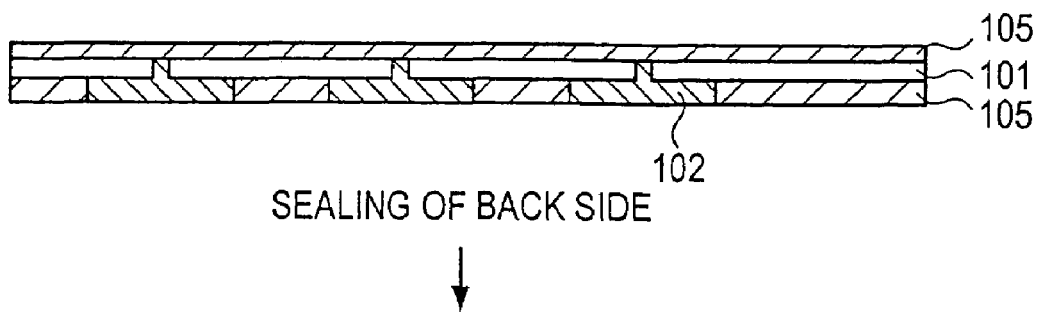

Then, as shown in FIG. 6(c), the polisher 107 is used for polishing the confronting surface (back side) of the circuit forming surface of the semiconductor wafer, the nearly concave groove 120 is exposed. Next, as shown in FIG. 6(d), the back side of the semiconductor wafer is entirely sealed with the resin.

Figure 6E:
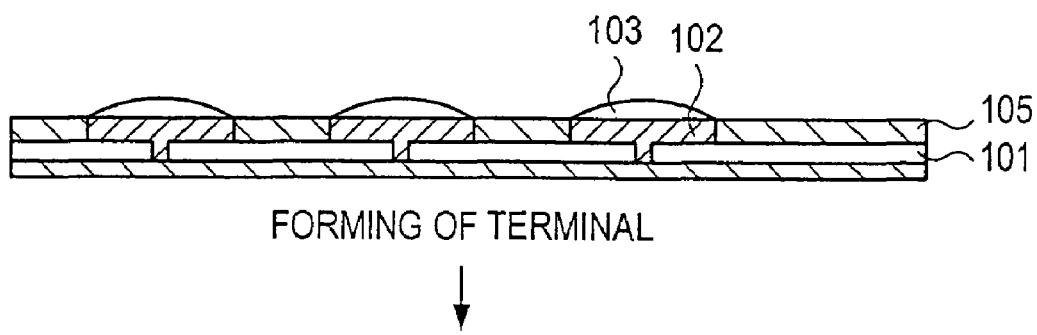

Further, as shown in FIG. 6(e), solder balls 103 are formed on the Cu posts 102 exposed on the circuit forming surface of the semiconductor wafer. Up to this step, the process is done in the wafer state in which plural semiconductor elements 101 are formed.

Figure 6F:
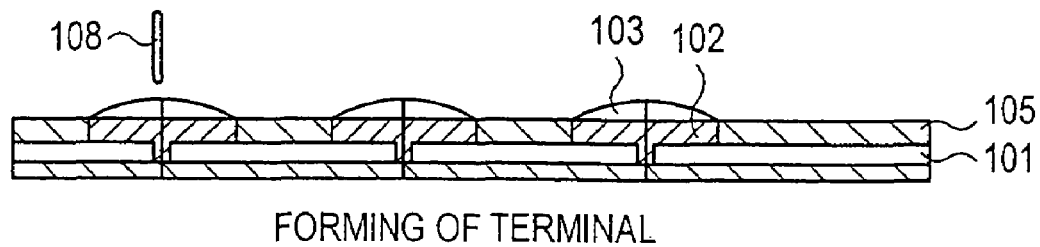

Still more, as shown in FIG. 6(f), the semiconductor wafer 101 is cut off by dicing, and divided (separated) into individual semiconductor devices. A cutter 108 used in this dicing process has a thinner blade than the cutter used in the forming process of the nearly concave groove 120. This is intended not to cut off the re-wiring 104 formed at the side surface of the nearly concave groove 120. In the area not forming the electrode terminals (not shown), the resin 105 is formed also at the side surface.

Figure 7A:
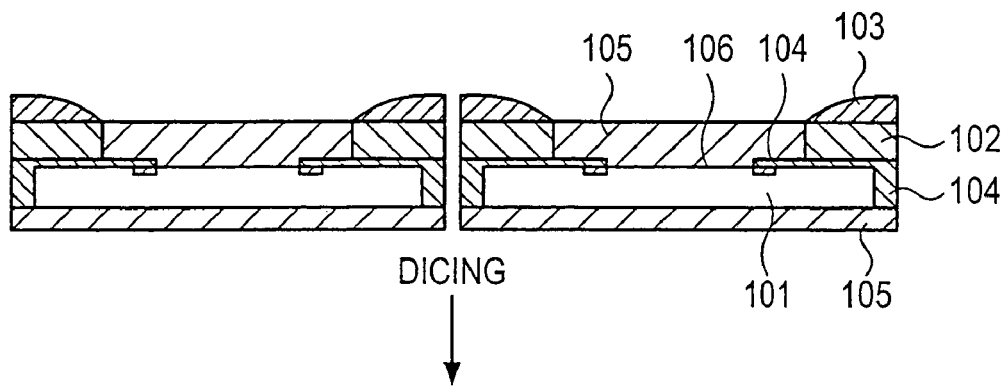
FIGS. 7(a)-7(c) are a flowchart showing the manufacturing process of the semiconductor element in the first embodiment.

FIG. 7(a) is a magnified view of the individual piece of the semiconductor device separated in FIG. 6(f). This diagram is same as FIG. 6(f), and its explanation is omitted.

Figure 7B:
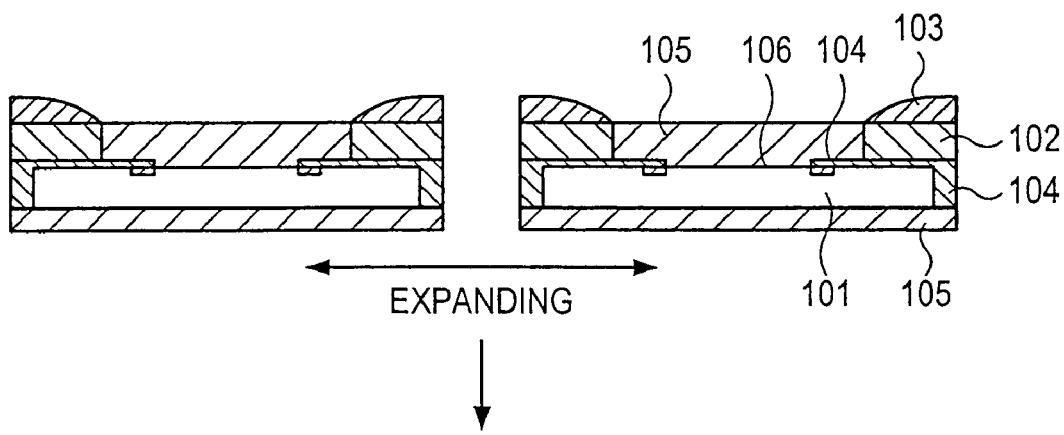

Next, as shown in FIG. 7(b), the individual semiconductor device is isolated from the adjacent semiconductor device by a wider gap. Usually, the individual semiconductor devices are mounted on the tape, and the interval of the semiconductor devices can be widened by pulling (expanding) the tape.

Figure 7C:
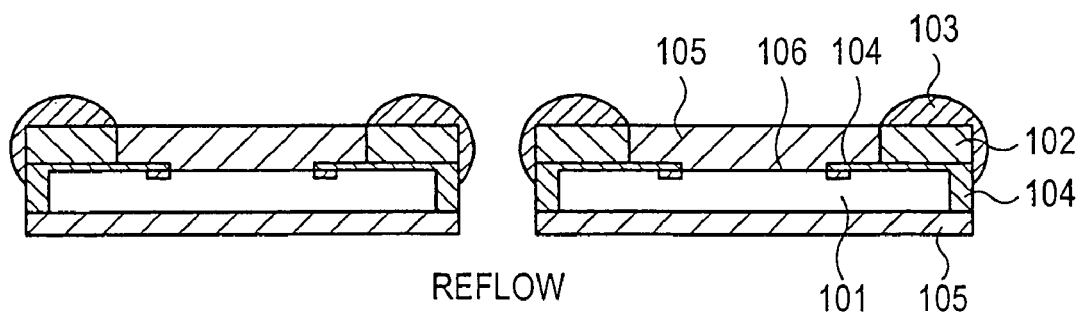

Further, as shown in FIG. 7(c), the individual semiconductor device is process by reflow in a reflow furnace at temperature of, for example, about 230° C. This reflow process is intended to soften the solder balls 103 formed on the Cu posts 102, so as to connect electrically also to the Cu re-wiring 104 formed on the side surface of the semiconductor device.

Thus, the embodiment presents the semiconductor device, in which a part of wiring is formed at the side surface of the semiconductor element, bump electrodes are formed nearly in the same plane as the wiring, and the back side of the semiconductor element is sealed with resin. As a result, across the resin (for example, a thickness of about 50 µm) formed on the back side of the semiconductor element, plural semiconductor devices can be mounted in a longitudinal profile by electrically connecting to the other semiconductor device through the solder balls by way of the wiring and bump electrodes used as electrode terminals. Thus, plural semiconductor devices are mounted in a longitudinal profile, and the mounting density of semiconductor devices can be heightened.

Figure 8:
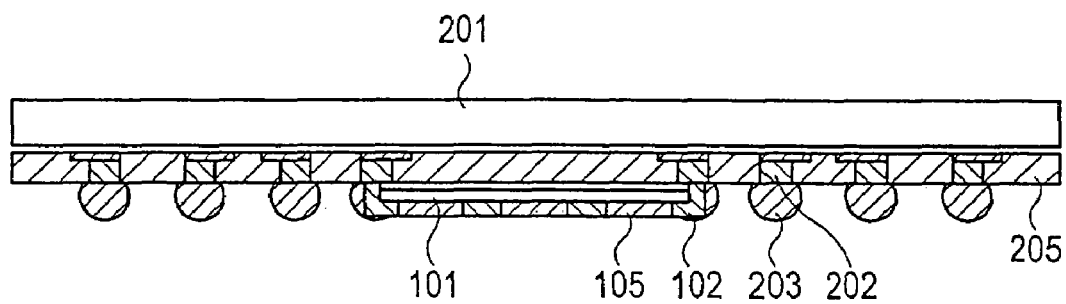
FIG. 8 is a sectional view showing a structure of a stack type semiconductor device in the first embodiment.
Figure 9:
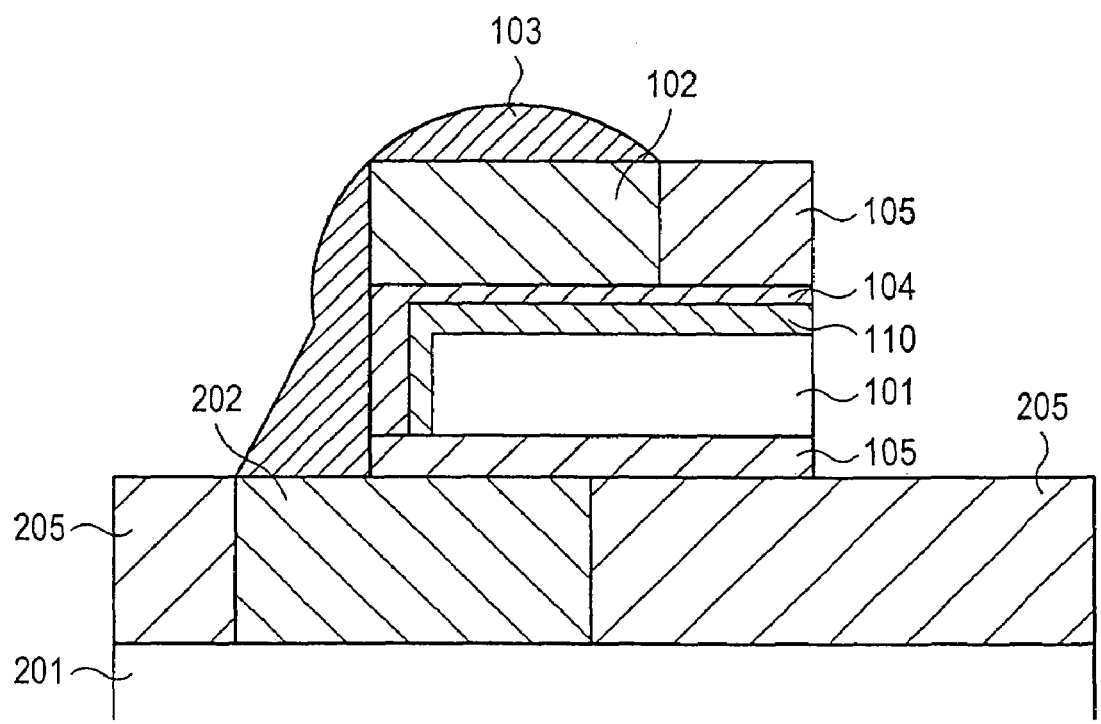
FIG. 9 is a magnified sectional view showing the structure of the stack type semiconductor device in the first embodiment.
Figure 10:
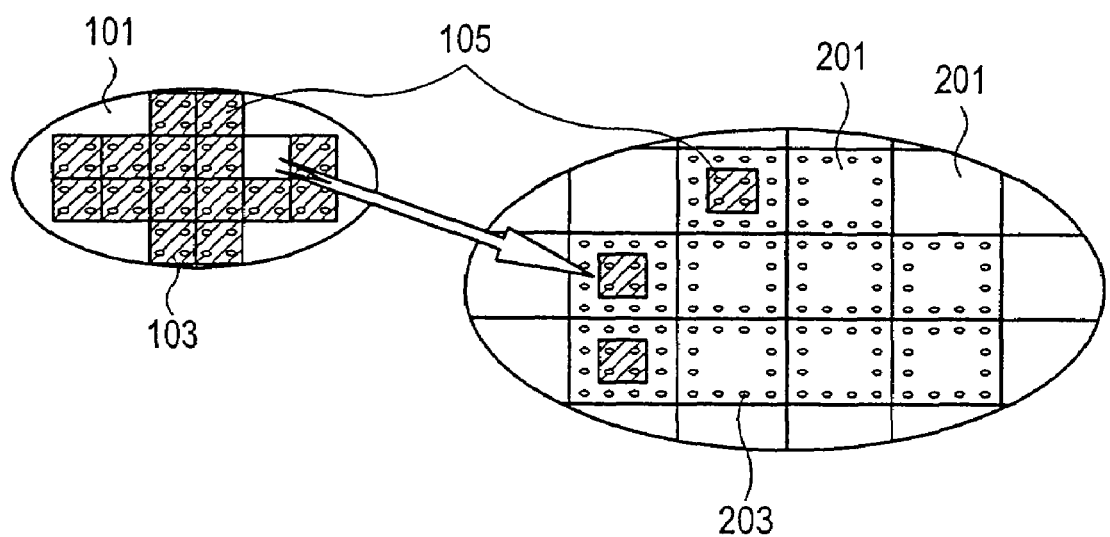
FIG. 10 is an explanatory diagram of manufacturing method of the stack type semiconductor device in the first embodiment.

A stack type semiconductor device manufactured by using the above semiconductor devices is explained by referring to FIG. 8, FIG. 9, and FIG. 10. FIG. 8 is a sectional view showing the structure of the stack type semiconductor device of the embodiment. FIG. 9 is a magnified sectional view showing the structure of the stack type semiconductor device of the embodiment. FIG. 10 is an explanatory diagram of manufacturing method of the stack type semiconductor device.

In this embodiment, the semiconductor device of the embodiment is mounted on other conventional semiconductor device in which electrodes for connecting the semiconductor device of the embodiment electrically are formed on the circuit forming surface.

As shown in FIG. 8 and FIG. 9, in other conventional semiconductor device Cu posts 202 of height of, for example, about 100 µm, resin 205, and solder balls 203 with height of, for example, about 300 µm are formed on the semiconductor element 201 of height of, for example, about 350 µm.

Further, on the ball electrodes 203 of other conventional semiconductor device, the semiconductor device of the embodiment is mounted, with its back side as the contact surface, so that the Cu re-wiring 104 and Cu posts 103 formed at the side surface of the semiconductor device of the embodiment may be formed at nearly same positions, and is electrically connected to the electrodes of the other conventional semiconductor device through the solder balls 103.

In the semiconductor device of the embodiment, since the back side is sealed with resin, it can be mounted without shorting with other conventional semiconductor device. Also in the semiconductor device of the embodiment, since the Cu re-wiring 104 and Cu posts 102 are formed at the side surface, it can be easily connected electrically to the electrodes of the other conventional semiconductor device through the solder balls 103.

As shown in FIG. 10, the other conventional semiconductor device 201 is formed on the semiconductor wafer without being divided. On the ball electrodes 203 of such other conventional semiconductor device 201, the semiconductor device of the embodiment is mounted, with its back side as the contact surface, so that the Cu re-wiring 104 and Cu posts 103 formed at the side surface of the semiconductor device of the embodiment may be formed at nearly same positions.

The semiconductor device of the embodiment is mounted at the time of forming solder balls 103 after exposing the Cu posts 102 by polishing the resin on the circuit forming surface.

Afterward, reflow is processed in a reflow furnace at temperature of, for example, about 230° C. This reflow process is intended to soften the solder balls 203 formed on the Cu posts 202, so as to connect electrically also to the Cu re-wiring 104 formed on the side surface of the semiconductor device of the embodiment.

Further, the semiconductor wafer having other conventional semiconductor device mounting the semiconductor device of the embodiment is cut into individual pieces, and plural stack type semiconductor device are formed.

Thus, in the stack type semiconductor device of the embodiment, since the semiconductor devices are connected with solder balls from the back side, and are electrically connected to the wiring at the side surface, the mounting area of the substrate can be decreased.

Second Embodiment

The semiconductor device of this embodiment is different from that of the first embodiment, that is, the end portion of the Cu re-wiring formed on the side surface of the semiconductor element is not sealed with resin on the confronting surface of the circuit forming surface. The semiconductor device of the embodiment is described by referring to FIG. 11 to FIG. 16.

Figure 11:
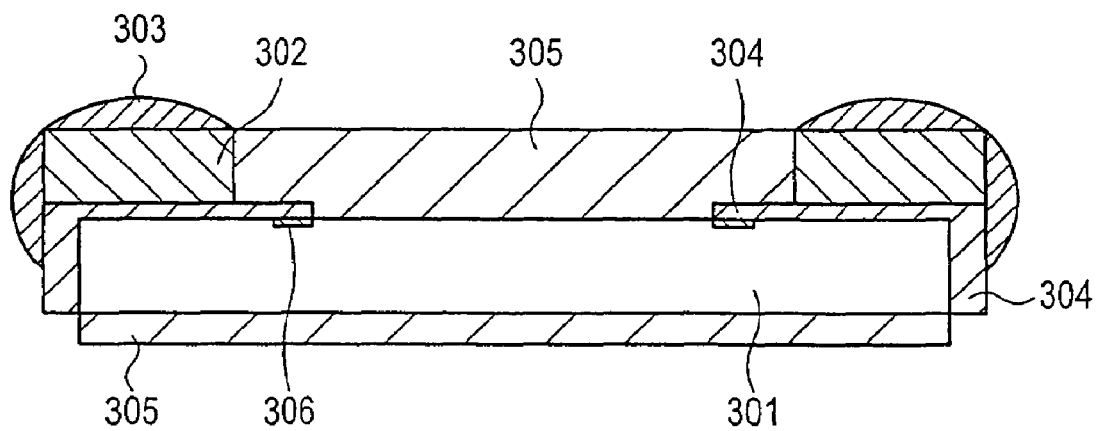
FIG. 11 is a sectional view showing a structure of a semiconductor element in a second embodiment.
Figure 12:
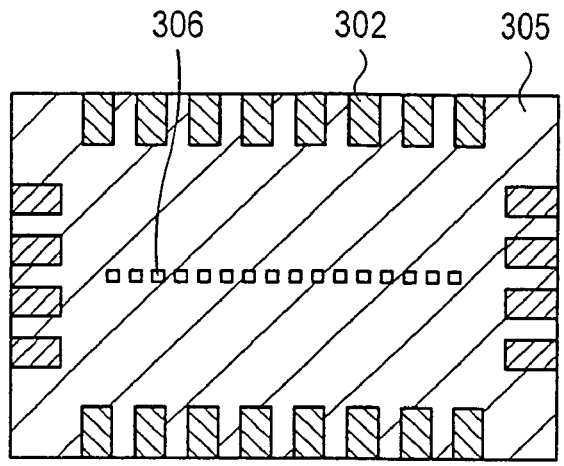
FIG. 12 is a top view showing the structure of the semiconductor element in the second embodiment.

As shown in FIG. 11 and FIG. 12, in the semiconductor device of the embodiment, in the semiconductor device of the embodiment, electrode pads 306 made of, for example, Al electrodes are formed on the semiconductor element 301, and Cu re-wiring 304 is formed, for example, so as to be connected electrically to the electrode pads 306. Further, this Cu re-wiring 304 is connected electrically to Cu posts 302 of, for example, about 100 µm in height. The circuit forming surface of the semiconductor element 301 is sealed by the resin 305 exposing the surface of the Cu posts 302. On the exposed surface of the Cu posts 302, metal electrodes (ball electrodes) such as solder balls 303 are formed. On the other hand, on the confronting surface (back side) of the circuit forming surface of the semiconductor element 301, other parts than the end portion of the Cu re-wiring formed at the side surface are sealed with resin.

The semiconductor device of the embodiment is different from the first embodiment in that the end portion of the Cu re-wiring of the side surface of this semiconductor element 301 is not sealed with resin.

Figure 13:
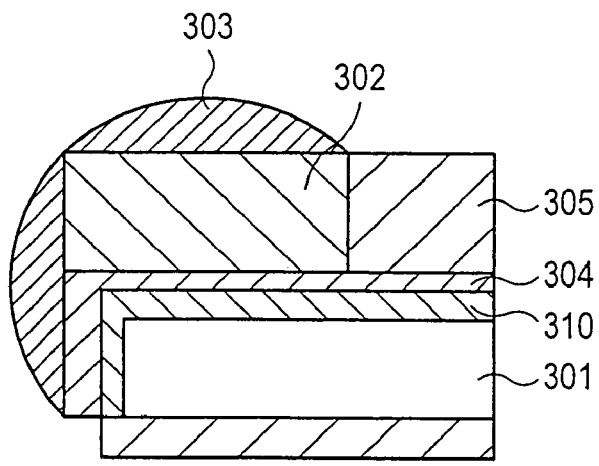
FIG. 13 is a magnified view showing the detail of the terminal area of the semiconductor element in the second embodiment.
Figure 14:
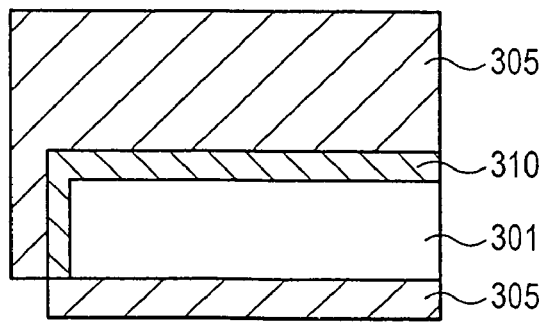
FIG. 14 is a magnified view showing the detail of the terminal non-forming area of the semiconductor element in the second embodiment.

The terminal portion of the semiconductor device of the embodiment is explained by referring to FIG. 13 and FIG. 14. FIG. 13 is a magnified view showing the detail of the terminal area of the semiconductor element of this embodiment. FIG. 14 is a magnified view showing the detail of the terminal non-forming area of the semiconductor element of the embodiment.

As shown in FIG. 13, an insulating layer 310 is formed on the circuit forming surface and side surface of a semiconductor element 301, and a re-wiring 304 is formed on this insulating layer 310. Further, a Cu post 302 is formed on the re-wiring 304 of the end portion (side surface) of the semiconductor element 301, and the re-wiring 304 up to the Cu post 302 is sealed with resin 305. The confronting surface (back side) of the circuit forming surface of the semiconductor element 301 is sealed with the resin 305 in the region other than the end portion of the Cu re-wiring 304 formed at the side surface of the semiconductor element 301.

On the other hand, in the electrode terminal non-forming area, as shown in FIG. 14, an insulating layer 310 is formed on the circuit forming surface and side surface of the semiconductor element 301, and this insulating layer 310 is sealed with the resin 305. The entire surface of the confronting surface (back side) of the circuit forming surface of the semiconductor element 301 is sealed with the resin 305.

In this embodiment, at the back side of the semiconductor element, since resin is not formed in the end portion of the Cu re-wiring formed on its side surface, bonding of solder is easier. As a result, peeling of the semiconductor device can be prevented when mounted on other semiconductor device.

Referring now to FIG. 15, the manufacturing process of the semiconductor device of the embodiment is explained. FIG. 15 is a flowchart showing the manufacturing process of the semiconductor device of the embodiment. In the manufacturing method of the semiconductor device of the embodiment, the process before resin sealing is same as in the first embodiment shown in FIG. 5, and its explanation is omitted.

Figure 15A:
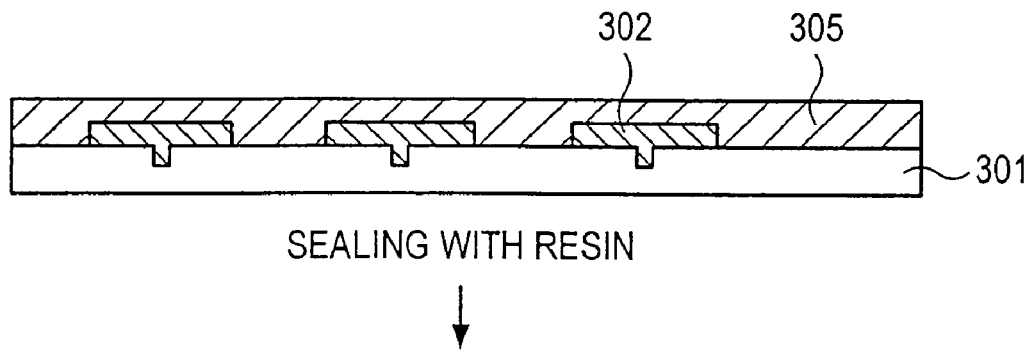
FIGS. 15(a)-15(g) are a flowchart showing the manufacturing process of the semiconductor element in the second embodiment.
Figure 15B:
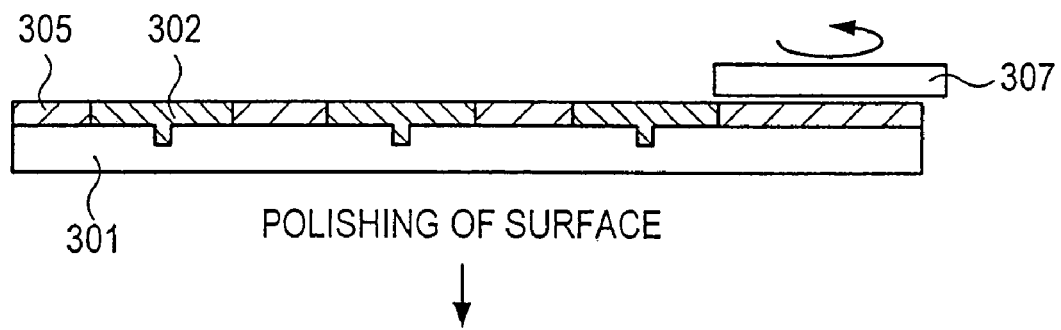

First, as shown in FIG. 15(a), the circuit forming surface of the semiconductor element 301 is sealed with the resin 305 so as to be at least as high as or higher than the Cu post 302. Next, as shown in FIG. 15(b), by polishing the resin 305 formed on the circuit forming surface of the semiconductor element 301 with polisher 307, the surface of the Cu post 302 is exposed.

Figure 15C:
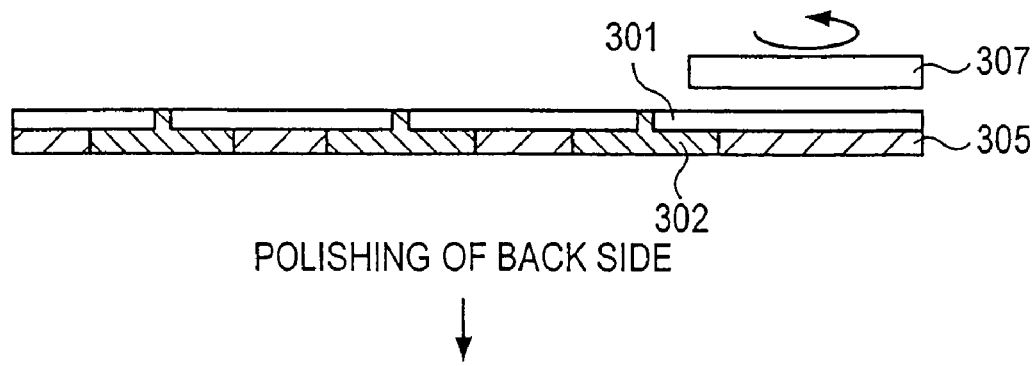
Figure 15D:
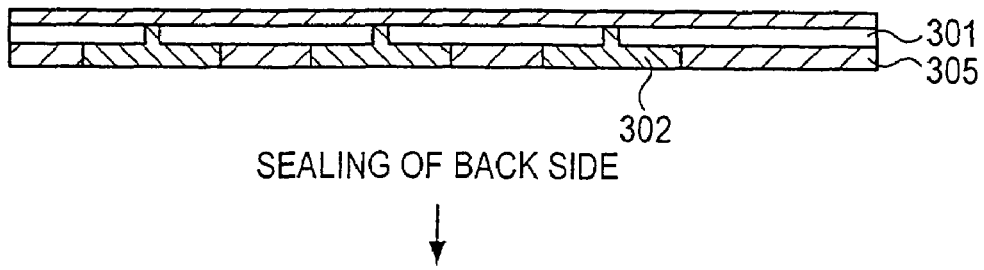

As shown in FIG. 15(c), polishing the confronting surface (back side) of the circuit forming surface of the semiconductor wafer, the nearly concave groove 320 is exposed. Then, the back side of the semiconductor wafer is entirely sealed with resin as shown in FIG. 15(d).

Figure 15E:
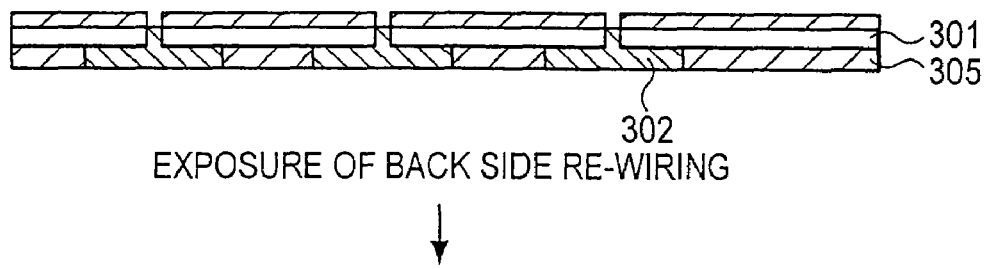

Consequently, for example, using laser as shown in FIG. 15(e), the resin formed in the nearly concave groove exposed on the confronting surface is removed. In this embodiment, unlike the first embodiment, since the resin in the nearly concave groove exposed on the back side of the semiconductor element is removed, the resin is not formed at the end of the re-wiring at the side surface of the semiconductor device.

Figure 15F:
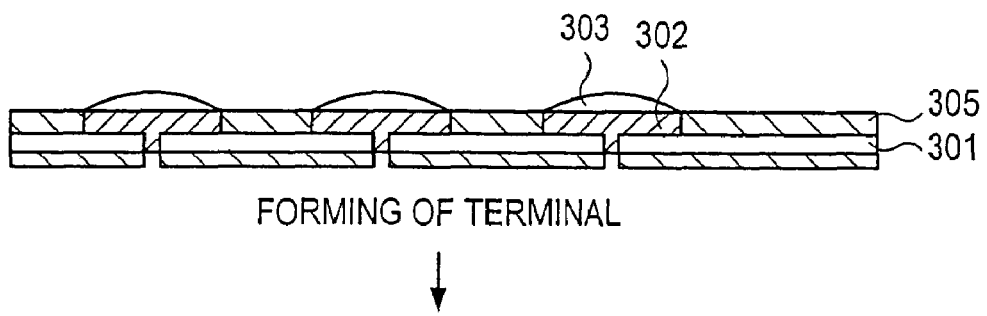

Further, as shown in FIG. 15(f), solder balls 303 are formed on the Cu posts 302 exposed on the circuit forming surface of the semiconductor wafer. Up to this step, the process is done in the wafer state in which plural semiconductor element 301 are formed.

Figure 15G:
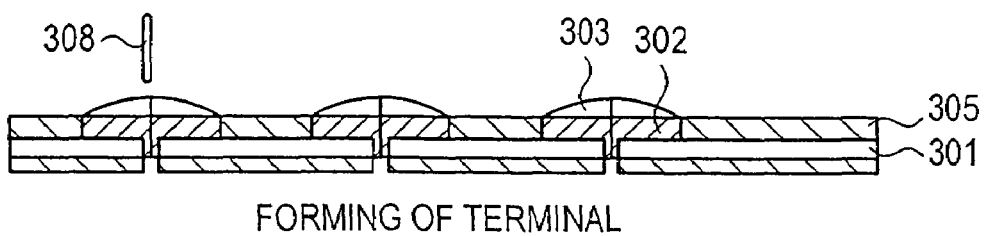

As shown in FIG. 15(g), the semiconductor wafer 301 is cut off by dicing, and divided (separated) into individual semiconductor devices. A cutter 308 used in this dicing process has a thinner blade than the cutter used in the forming process of the nearly concave groove 320. This is intended not to cut off the re-wiring 304 formed at the side surface of the nearly concave groove 320. In the area not forming the electrode terminals (not shown), the resin 305 is formed at the side surface.

Figure 16A:
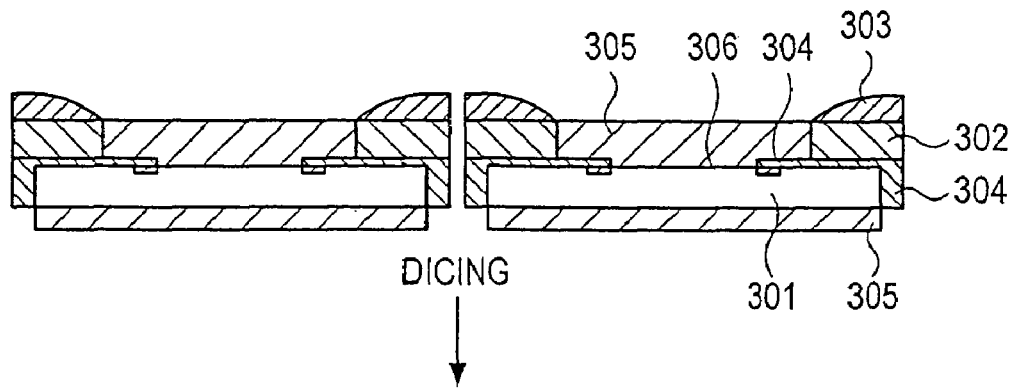
FIGS. 16(a)-16(c) are a flowchart showing the manufacturing process of the semiconductor element in the second embodiment.

FIG. 16(a) is a magnified view of the individual piece of the semiconductor device separated in FIG. 15(g). This diagram is same as FIG. 15(g), and its explanation is omitted.

Figure 16B:
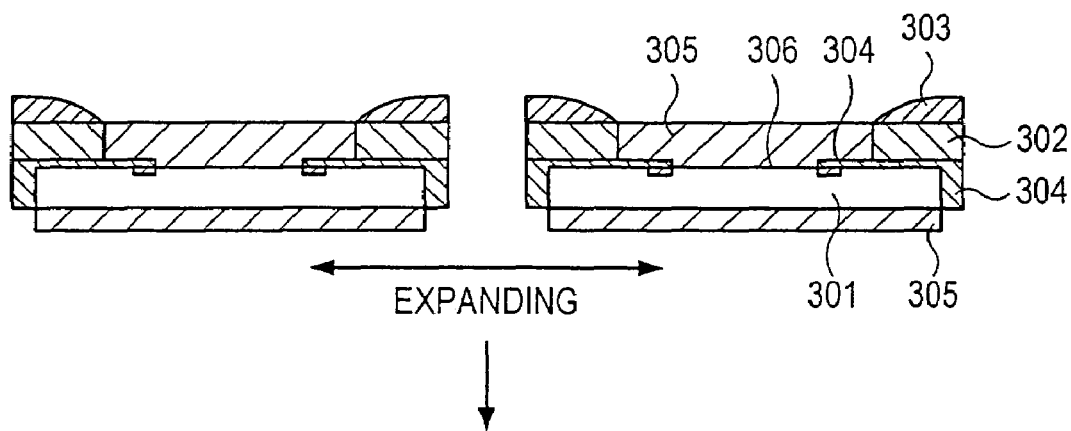

Next, as shown in FIG. 16(b), the individual semiconductor device is isolated from the adjacent semiconductor device by a wider gap. Usually, the individual semiconductor devices are mounted on the tape, and the interval of the semiconductor devices can be widened by pulling (expanding) the tape.

Figure 16C:
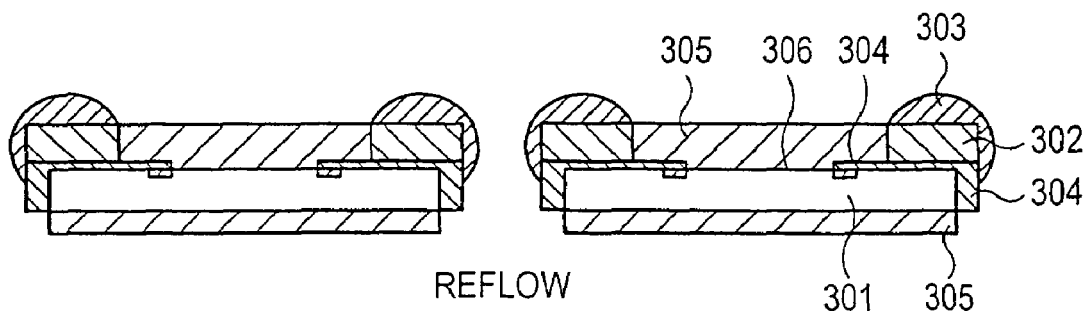

Further, as shown in FIG. 16(c), the individual semiconductor device is process by reflow in a reflow furnace at temperature of, for example, about 230° C. This reflow process is intended to soften the solder balls 303 formed on the Cu posts 302, so as to connect electrically also to the Cu re-wiring 304 formed on the side surface of the semiconductor device.

Thus, the embodiment presents the semiconductor device, in which a part of wiring is formed at the side surface of the semiconductor element, bump electrodes are formed nearly in the same plane as the wiring, and the back side of the semiconductor element is sealed with resin. As a result, across the resin (for example, a thickness of about 50 μm) formed on the back side of the semiconductor element, plural semiconductor devices can be mounted in a longitudinal profile by electrically connecting to the other semiconductor device through the solder balls by way of the wiring and bump electrodes used as electrode terminals. Thus, plural semiconductor devices are mounted in a longitudinal profile, and the mounting density of semiconductor devices can be heightened. Moreover, at the back side of the semiconductor device, since resin is not formed at the end of the wiring at the side surface of the semiconductor element, the solder can be bonded easily when mutually connecting the semiconductor devices. Hence, peeling of semiconductor devices can be prevented.

Figure 17:
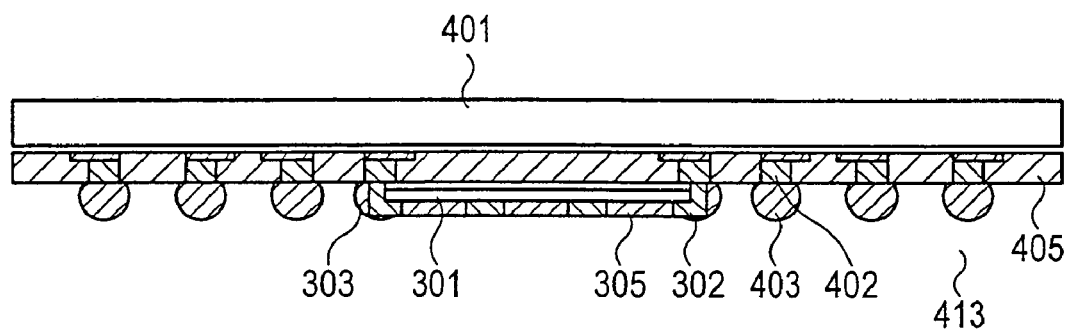
FIG. 17 is a sectional view showing a structure of a stack type semiconductor device in the second embodiment.
Figure 18:
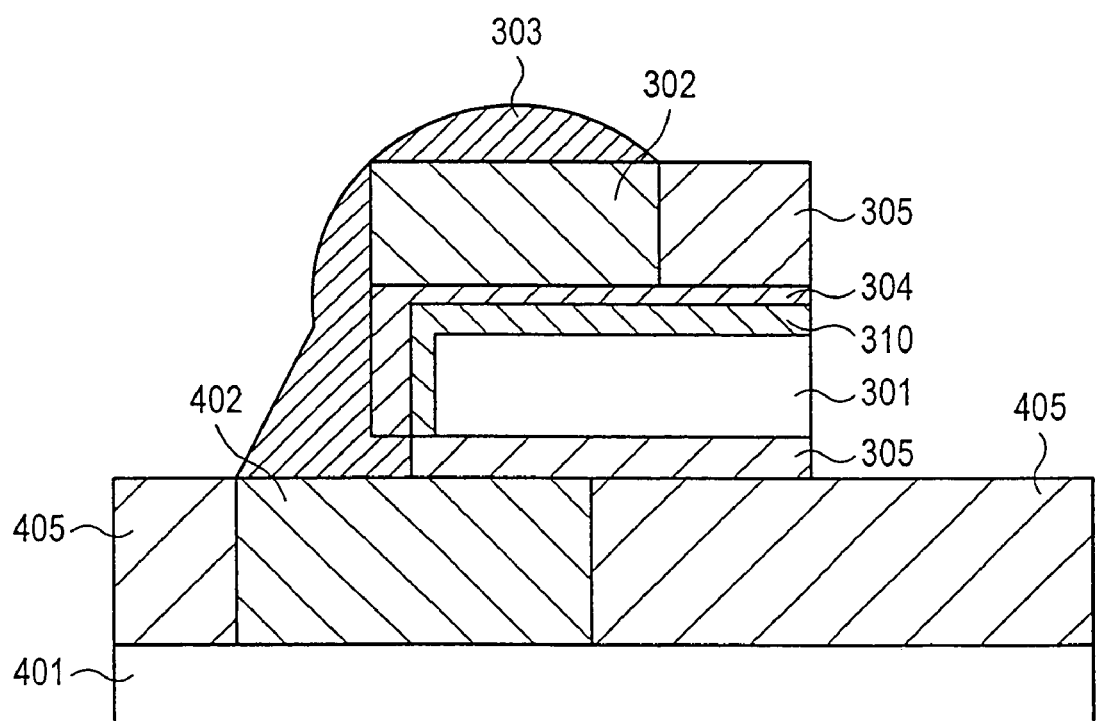
FIG. 18 is a magnified sectional view showing the structure of the stack type semiconductor device in the second embodiment.

A stack type semiconductor device manufactured by using the above semiconductor devices is explained by referring to FIG. 17 and FIG. 18. FIG. 17 is a sectional view showing the structure of the stack type semiconductor device of the embodiment. FIG. 18 is a magnified sectional view showing the structure of the stack type semiconductor device of the embodiment.

As shown in FIG. 17 and FIG. 18, in other conventional semiconductor device Cu posts 402 of height of, for example, about 100 μm, resin 405, and solder balls 403 with height of, for example, about 300 μm are formed on the semiconductor element 401 of height of about 350 μm.

Further, on the ball electrodes 403 of other conventional semiconductor device, the semiconductor device of the embodiment is mounted, with its back side as the contact surface, so that the Cu re-wiring 304 and Cu posts 303 formed at the side surface of the semiconductor device of the embodiment may be formed at nearly same positions, and is electrically connected to the electrodes of the other conventional semiconductor device through the solder balls 303.

In the semiconductor device of the invention, since the back side is sealed with resin, it can be mounted without shorting with other conventional semiconductor device. Also in the semiconductor device of the invention, since the Cu re-wiring 304 and Cu posts 302 are formed at the side surface, it can be easily connected electrically to the electrodes of the other conventional semiconductor device through the solder balls 303.

Thus, in the stack type semiconductor device of the embodiment, since the semiconductor devices are connected with solder balls from the back side, and are electrically connected to the wiring at the side surface, the mounting area of the substrate can be decreased. Moreover, at the back side of the semiconductor device, since resin is not formed at the end of the wiring of the side surface of the semiconductor element, it is easy to bond with solder, so that peeling of the semiconductor device can be prevented.

Third Embodiment

Figure 19:
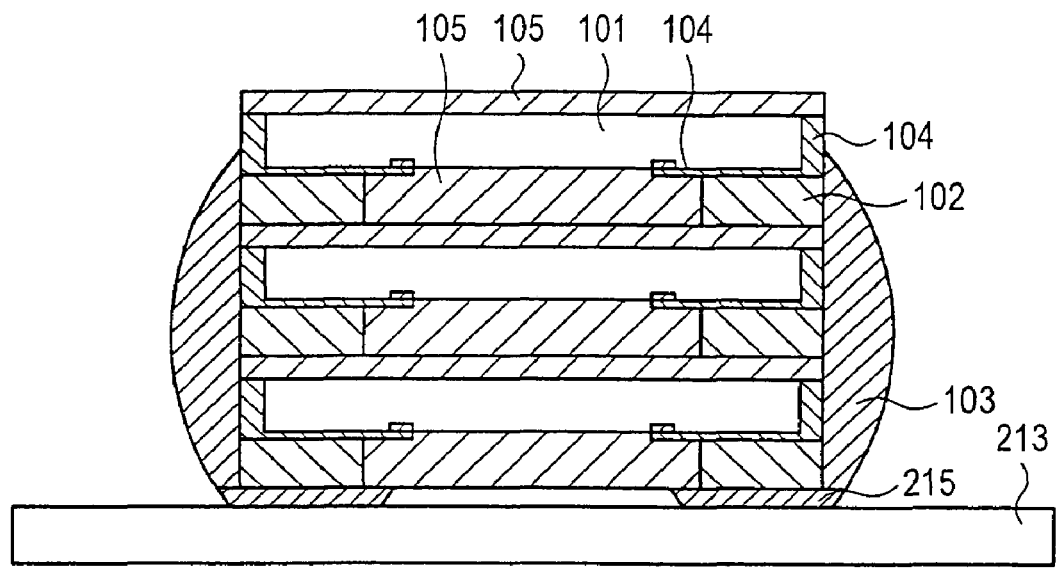
FIG. 19 is a sectional view of a stack type semiconductor device in a third embodiment.

Referring to FIG. 19, a stack type semiconductor device of this embodiment is explained. FIG. 19 is a sectional view of the stack type semiconductor device of the embodiment. The stack type semiconductor device of the embodiment is formed by mounting plural semiconductor device of the first embodiment on other conventional semiconductor device.

On the ball electrodes of the conventional other semiconductor device, the semiconductor device of the embodiment is mounted, with its back side as the contact surface, so that the Cu re-wiring 104 and Cu posts 103 formed at the side surface of the semiconductor device of the first embodiment may be formed at nearly same positions, and is electrically connected to the electrodes of the other conventional semiconductor device through the solder balls 103. The solder balls 103 contact solder balls disposed on electrode pad 213.

In the semiconductor device of the first embodiment, since the back side is sealed with resin, it can be mounted without shorting with other conventional semiconductor device. Also in the semiconductor device of the first embodiment, since the Cu re-wiring 104 and Cu posts 102 are formed at the side surface, it can be easily connected electrically to the electrodes of the other conventional semiconductor device through the solder balls 103.

Further in the embodiment, the bump electrodes and wiring of the side surface of the semiconductor device are mounted on the semiconductor device of the first embodiment so as to be nearly at same positions, and the semiconductor device of the first embodiment is connected electrically through the ball electrodes.

Thus, the embodiment presents a stack type semiconductor device mounting plural semiconductor devices in an area for one semiconductor device. As compared with the prior art, the substrate mounting area of the stack type semiconductor device can be extremely decreased.

Fourth Embodiment

Figure 20:
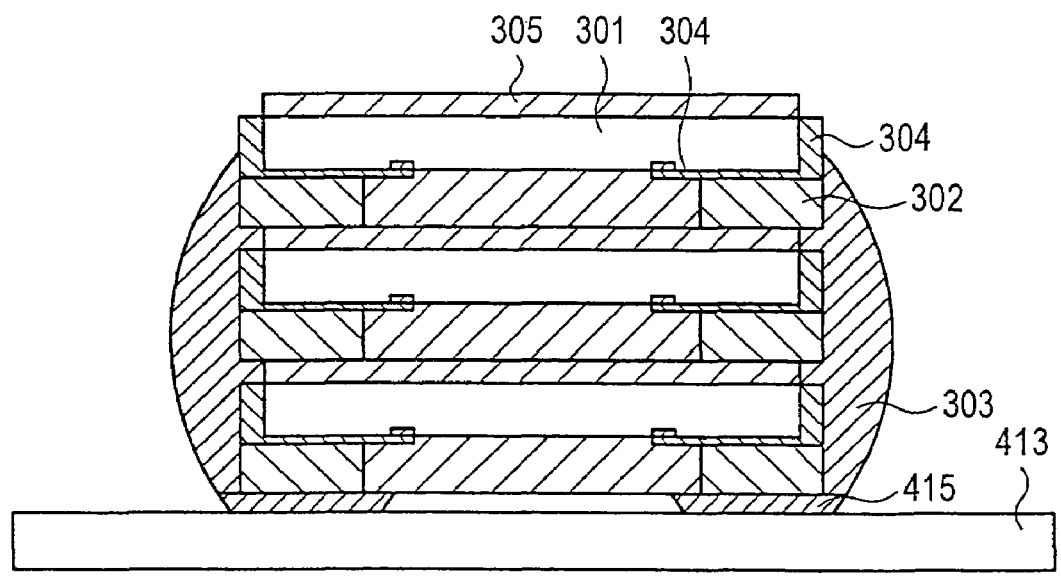
FIG. 20 is a sectional view of a stack type semiconductor device in a fourth embodiment.
Figure 21:
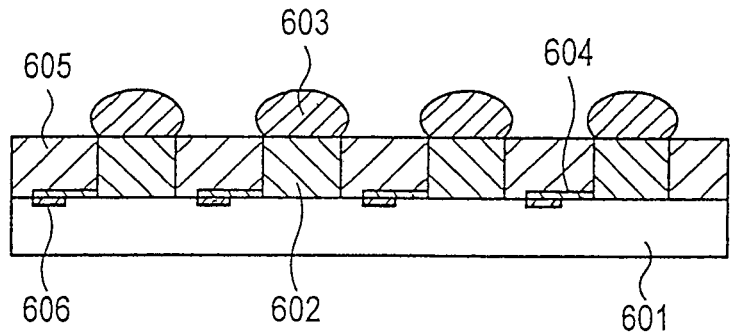
FIG. 21 is a sectional view showing a structure of a conventional semiconductor device.
Figure 22:
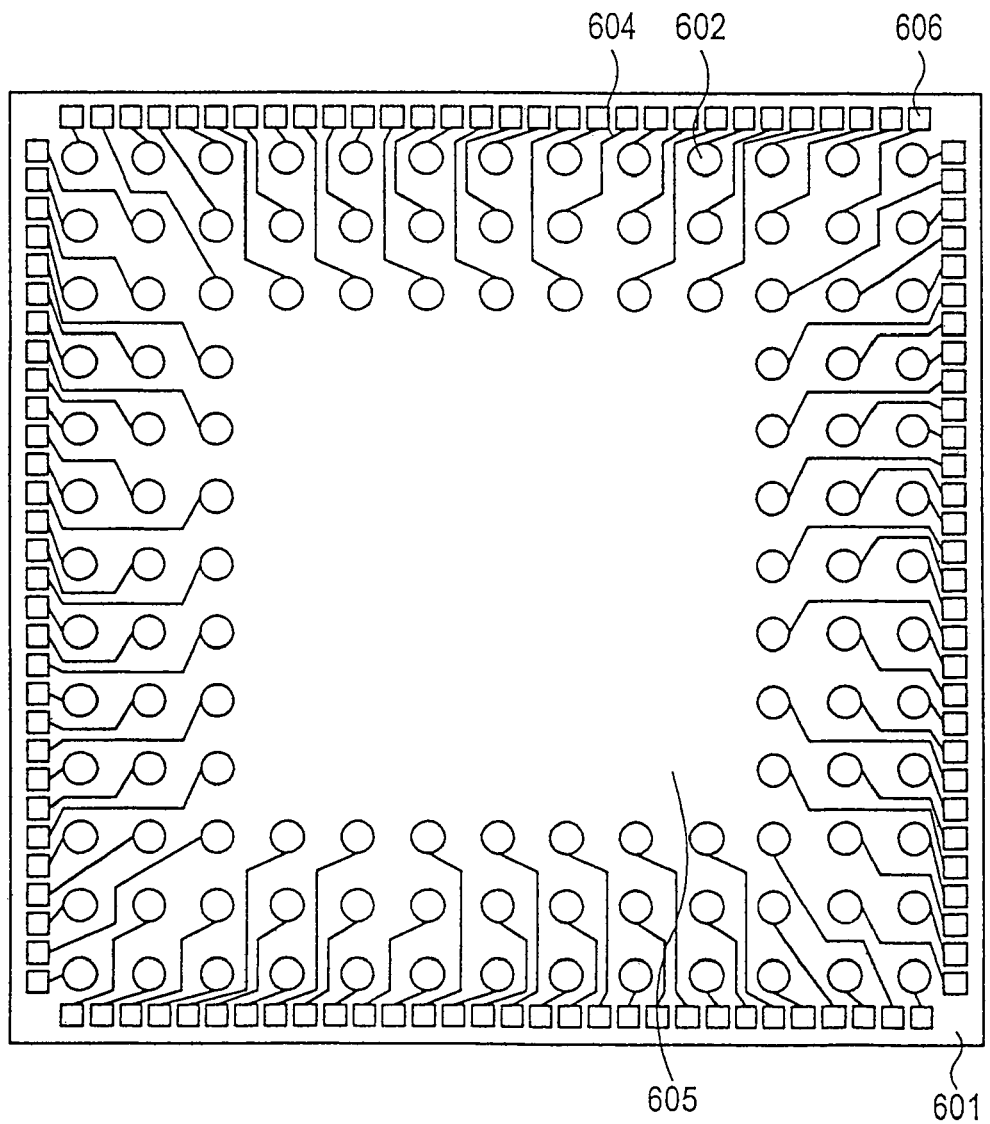
FIG. 22 is a top view showing the structure of the conventional semiconductor device.
Figure 23A:
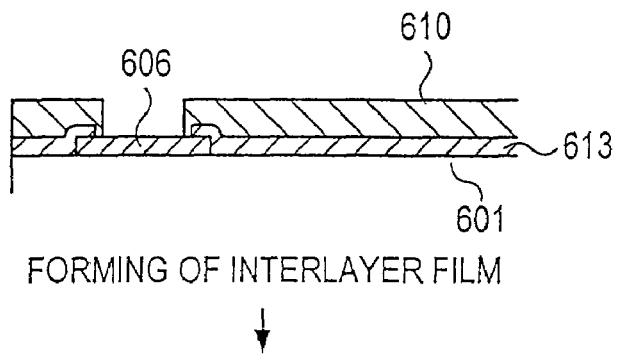
FIGS. 23(a)-23(e) are process sectional views for explaining the manufacturing method of the conventional semiconductor device.
Figure 23B:
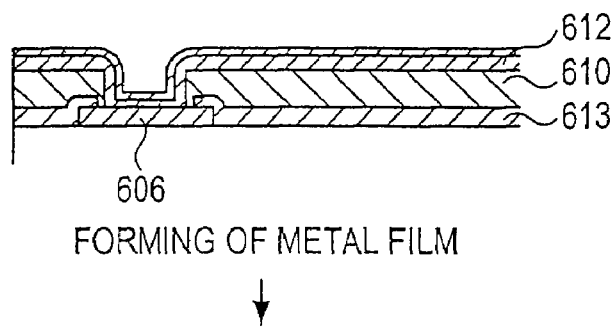
Figure 23C:
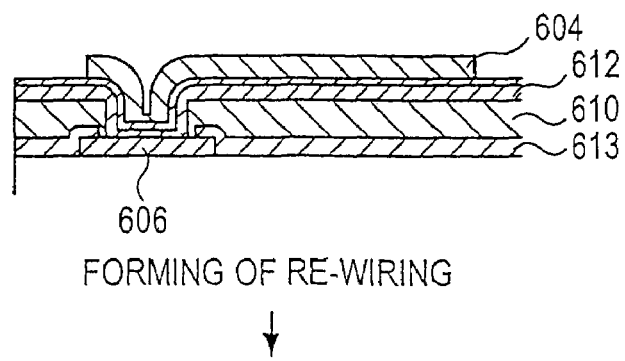
Figure 23D:
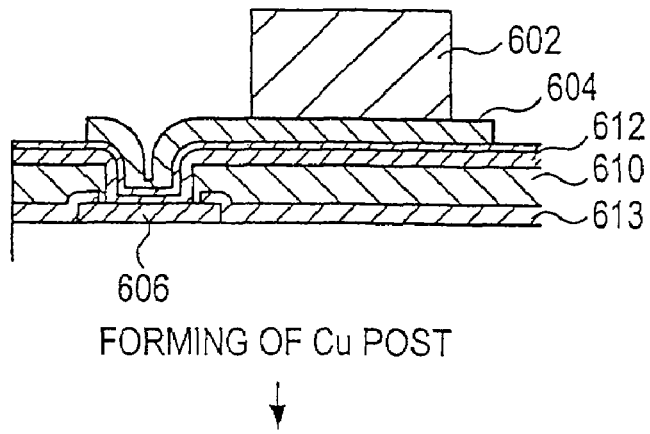
Figure 23E:
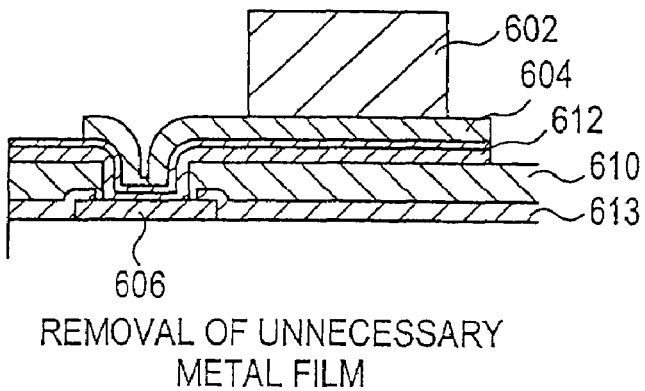
Figure 24A:
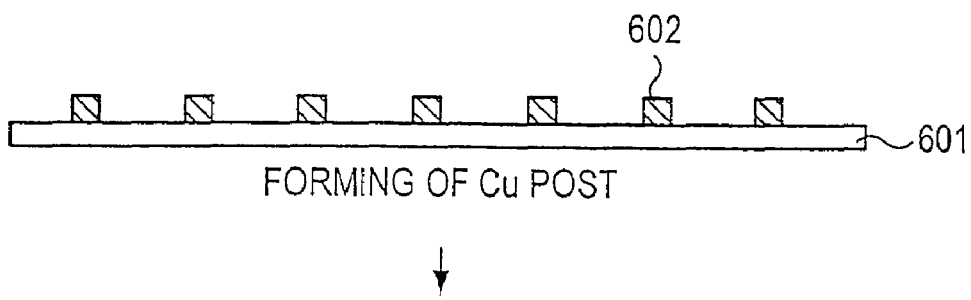
FIGS. 24(a)-24(e) are process sectional views for explaining the manufacturing method of the conventional semiconductor semiconductor device.
Figure 24B:
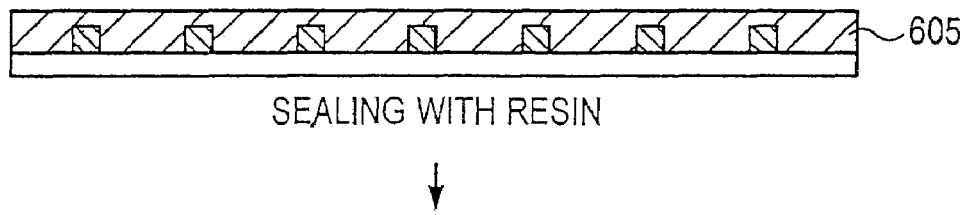
Figure 24C:
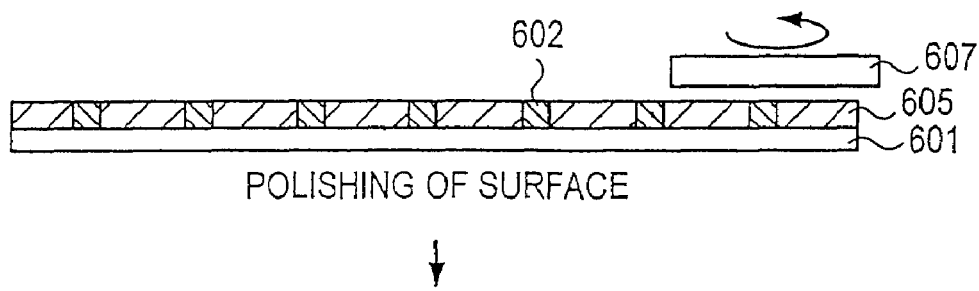
Figure 24D:
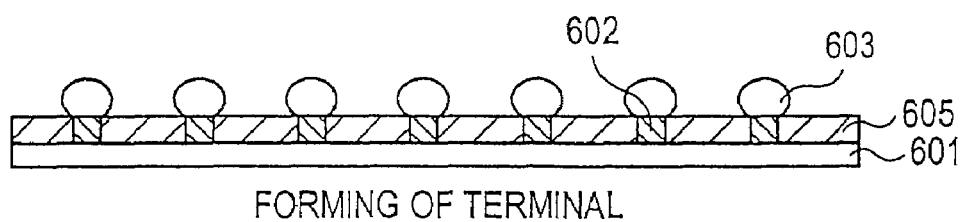
Figure 24E:
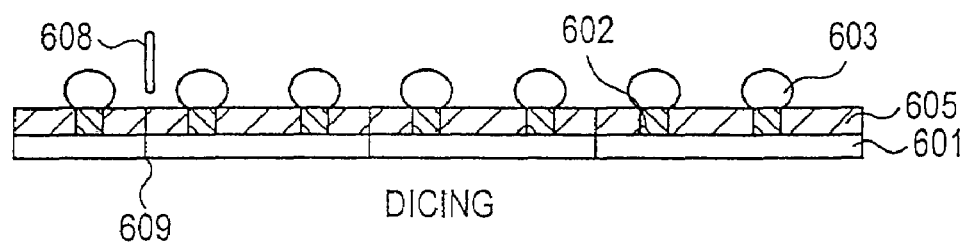
Figure 25A:
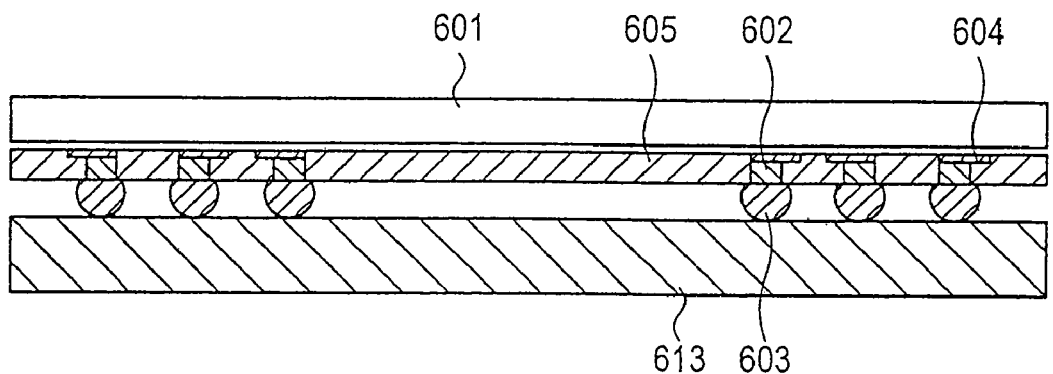
FIGS. 25(a)-25(c) are explanatory diagrams showing a configuration of a conventional semiconductor device mounting plural semiconductor elements.
Figure 25B:
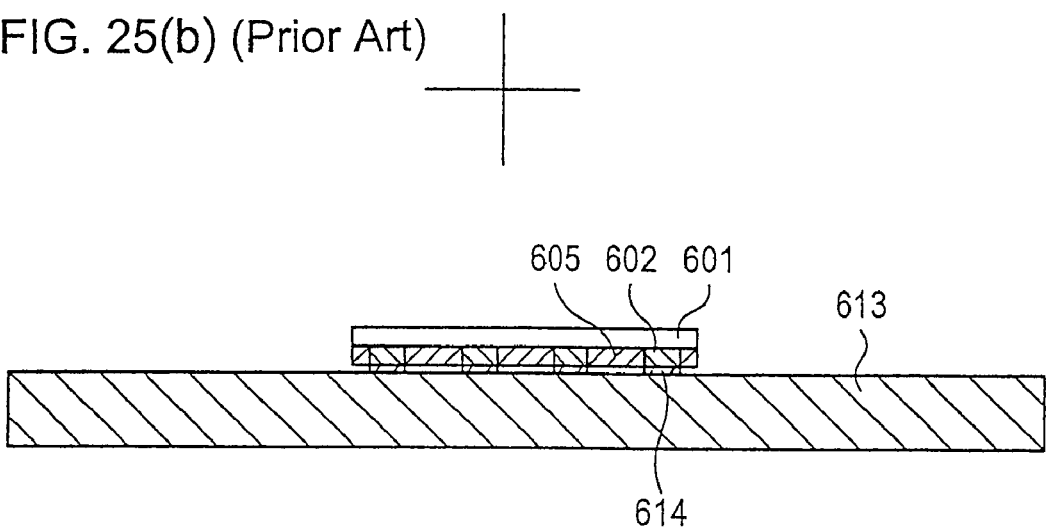
Figure 25C:
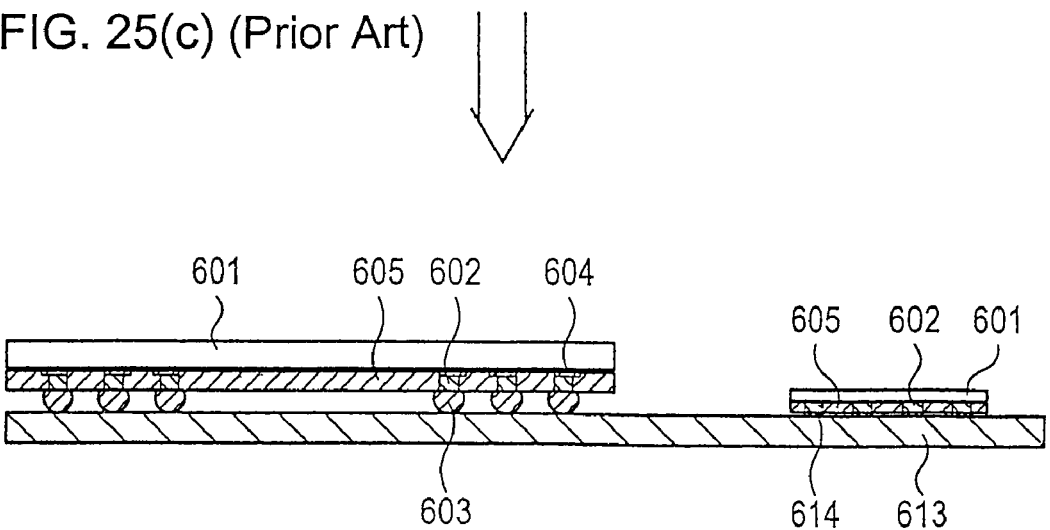

Referring to FIG. 20, a stack type semiconductor device of this embodiment is explained. FIG. 20 is a sectional view of the stack type semiconductor device of the embodiment. The stack type semiconductor device of the embodiment is formed by mounting plural semiconductor device of the second embodiment on other conventional semiconductor device.

On the ball electrodes of the conventional other semiconductor device, the semiconductor device of the second embodiment is mounted, with its back side as the contact surface, so that the Cu re-wiring 304 and Cu posts 302 formed at the side surface of the semiconductor device of the second embodiment may be formed at nearly same positions, and is electrically connected to the electrodes of the other conventional semiconductor device through the solder balls 303, which connect to solder balls 415 disposed on electrode pad 413.

In the semiconductor device of the second embodiment, since the back side is sealed with resin, it can be mounted without shorting with other conventional semiconductor device. Also in the semiconductor device of the embodiment, since the Cu re-wiring 304 and Cu posts 302 are formed at the side surface, it can be easily connected electrically to the electrodes of the other conventional semiconductor device through the solder balls 303.

Further in the embodiment, the bump electrodes and wiring of the side surface of the semiconductor device are mounted on the semiconductor device of the second embodiment so as to be nearly at same positions, and the semiconductor device of the second embodiment is connected electrically through the ball electrodes.

Thus, the embodiment presents a stack type semiconductor device mounting plural semiconductor devices in an area for one semiconductor device. As compared with the prior art, the substrate mounting area of the stack type semiconductor device can be extremely decreased. Further, at the back side of the semiconductor device, since resin is not formed at the end of the wiring of the side surface of the semiconductor element, it can be easily bonded with solder, and peeling of the semiconductor device can be prevented.

So far, preferred embodiments of the invention are explained, but it must be noted that the invention is not limited to the illustrated examples alone. For those skilled in the art, various changes and modifications are possible within the scope of the technical concept described in the claims, and such changes and modifications are understood to be included in the technical scope of the invention.

For example, in the foregoing embodiments, Cu re-wiring and Cu posts (bump electrodes) are used, but the re-wiring and bump electrodes may be made of other materials.

In the embodiments, the nearly concave groove is formed on the semiconductor element by using a cutter, but the nearly concave groove may be also formed by other method.

In the embodiments, the stack type semiconductor device is formed by mounting plural semiconductor devices of the first embodiment, or the stack type semiconductor device is formed by mounting plural semiconductor devices of the second embodiment, but the stack type semiconductor device may be also formed by using both semiconductor devices of the first embodiment and semiconductor devices of the second embodiment at the same time.

In the semiconductor device, a part of wiring is formed at the side surface of the semiconductor element, and the bump electrodes are formed nearly on the same plane as the wiring, and the back side of the semiconductor element is sealed with resin, and therefore across the resin formed at the back side of the semiconductor element, plural semiconductor devices can be mounted in a longitudinal profile by electrically connecting to the other semiconductor device through the solder balls by way of the wiring and bump electrodes used as electrode terminals. Thus, plural semiconductor devices are mounted in a longitudinal profile, and the mounting density of semiconductor devices can be heightened.

What is claimed is:

1. A manufacturing method of a semiconductor device comprising:

forming a nearly concave groove of a specified depth in a boundary region of a circuit forming surface of semiconductor elements, in a semiconductor wafer having a region for plural semiconductor elements, forming an insulating layer in a specified region of a side surface of said nearly concave groove and on said circuit forming surface, forming a wiring in a specified region of said circuit forming surface, including an entire surface of an inside of the nearly concave groove, forming a bump electrode having a specified height on said wiring at the boundary region, including the inside of the nearly concave groove, sealing the circuit forming surface with a resin, the resin exposing a surface of said bump electrode, polishing a confronting surface of the semiconductor wafer opposite the circuit forming surface to expose the nearly concave groove at said confronting surface, sealing an entirety of the confronting surface of the semiconductor wafer with resin, including an end portion of the wiring formed at an exposed side surface of the nearly concave groove, forming a ball electrode on said bump electrode, cutting the semiconductor wafer along the exposed nearly concave groove, and forming plural semiconductor devices having side surfaces thereof exposing said ball electrode, the bump electrode and the wiring, and heating the cut semiconductor devices at a specified temperature, so that parts of the ball electrode formed on the bump electrode are on side surfaces of the semiconductor devices.

2. The manufacturing method of a semiconductor device of claim 1, further comprising:
    removing the resin formed in the exposed nearly concave groove from the confronting surface,
    said removing the resin occurring between said sealing an entirety of the confronting surface and said forming a ball electrode.

3. The manufacturing method of a semiconductor device of claim 2, wherein said removing the resin comprises using a laser.

4. A manufacturing method for a stack type semiconductor device, the semiconductor device including
    a semiconductor element having plural electrodes on a circuit forming surface,
    a wiring formed at least on said circuit forming surface and having one end connected to said electrodes,
    a bump electrode connected to said wiring,
    a sealing resin that exposes a surface of said bump electrode and that seals the circuit forming surface of said semiconductor element, and
    a ball electrode formed on the surface of said bump electrode exposed from said sealing resin,
    wherein a part of said wiring is formed also at a side surface of said semiconductor element, and said bump electrode is formed so that a side surface of the bump electrode is substantially flush with said wiring formed at the side surface of said semiconductor element,
    at least a part of said ball electrode is formed so as to be electrically connected to said wiring at the side surface of said semiconductor element, and
    the side surface of said semiconductor element is sealed with the sealing resin exposing said wiring, and a confronting surface of said semiconductor element that is opposite the circuit forming surface is sealed with the sealing resin on an entire surface thereof,
    the manufacturing method comprising:
    mounting the semiconductor device on a second semiconductor device having ball electrodes with the confronting surface of the semiconductor element as a contact surface, whereby said ball electrodes of said second semiconductor device and the wiring formed at the side surface of the semiconductor device are at substantially same positions, and
    heating the second semiconductor device at a specified temperature, to connect the bump electrode of the semiconductor device and the wiring formed at the side surface of the semiconductor device to the second semiconductor device through said ball electrodes.

5. The manufacturing method of claim 4, wherein the end surface of the wiring formed at the side surface of the semiconductor element is sealed with the sealing resin.

6. A manufacturing method for a stack type semiconductor device, the semiconductor device including
    a semiconductor element having plural electrodes on a circuit forming surface,
    a wiring formed at least on said circuit forming surface and having one end connected to said electrodes,
    a bump electrode connected to said wiring,
    a sealing resin that exposes a surface of said bump electrode and that seals the circuit forming surface of said semiconductor element, and
    a ball electrode formed on the surface of said bump electrode exposed from said sealing resin,
    wherein a part of said wiring is formed also at a side surface of said semiconductor element, and said bump electrode is formed so that a side surface of the bump electrode is substantially flush with said wiring formed at the side surface of said semiconductor element,
    at least a part of said ball electrode is formed so as to be electrically connected to said wiring at the side surface of said semiconductor element, and
    the side surface of said semiconductor element is sealed with the sealing resin exposing said wiring, and a confronting surface of said semiconductor element that is opposite the circuit forming surface is sealed with the sealing resin on an entire surface thereof,
    the manufacturing method comprising:
    mounting the semiconductor device on a second semiconductor device having ball electrodes with the confronting surface of the semiconductor element as a contact surface, whereby said ball electrodes of said second semiconductor device and the wiring formed at the side surface of the semiconductor device are at substantially same positions,
    mounting an additional one or two or more of the semiconductor devices, with the confronting surface as a contact surface, so that additional ball electrodes of said second semiconductor device and the wirings formed at the side surface of the additional semiconductor devices are at substantially same positions, and
    heating the second semiconductor device at a specified temperature, to connect the bump electrodes of the semiconductor devices and the wirings formed at the side surfaces of the semiconductor devices to the second semiconductor device through said ball electrodes.

7. The manufacturing method of claim 6, wherein the end surface of the wiring formed at the side surface of the semiconductor elements are sealed with the sealing resin.

8. A manufacturing method for a stack type semiconductor device, the semiconductor device including
    a semiconductor element having plural electrodes on a circuit forming surface,
    a wiring formed at least on said circuit forming surface and having one end connected to said electrodes,
    a bump electrode connected to said wiring,
    a sealing resin that exposes a surface of said bump electrode and that seals the circuit forming surface of said semiconductor element, and
    a ball electrode formed on the surface of said bump electrode exposed from said sealing resin,
    wherein a part of said wiring is formed also at a side surface of said semiconductor element, and said bump electrode is formed so that a side surface of the bump electrode is substantially flush with said wiring formed at the side surface of said semiconductor element,
    at least a part of said ball electrode is formed so as to be electrically connected to said wiring at the side surface of said semiconductor element, and
    the side surface of said semiconductor element is sealed with the sealing resin exposing said wiring, and a confronting surface of said semiconductor element that is opposite the circuit forming surface is sealed with the sealing resin on an entire surface thereof,
    the manufacturing method comprising:
    mounting the semiconductor device on a second semiconductor device having ball electrodes with the confronting surface of the semiconductor element as a contact surface, whereby said ball electrodes of said second semiconductor device and the wiring formed at the side surface of the semiconductor device are at substantially same positions,
    mounting one or two or more semiconductor devices, or other semiconductor devices each comprising a first semiconductor element having first plural electrodes on a first circuit forming surface, a first wiring formed at least on said first circuit forming surface and having one end connected to said first electrodes, a first bump electrode connected to said first wiring, a first sealing resin that exposes a surface of said first bump electrode and that seals the first circuit forming surface of said first semiconductor element, and a first ball electrode formed on the surface of said first bump electrode exposed from said first resin, in which a part of said first wiring is formed also at a side surface of said first semiconductor element, and said first bump electrode is formed so that a side surface of the first bump electrode is substantially flush with said first wiring formed at the side surface of said first semiconductor element, at least a part of said first ball electrode is formed so as to be electrically connected to said first wiring at the side surface of said first semiconductor element, and the side surface of said first semiconductor element is sealed with the first sealing resin exposing said first wiring, and a confronting surface of said first semiconductor element that is opposite the first circuit forming surface is sealed with the first sealing resin on an other surface than the end surface of the first wiring formed at the side surface of the first semiconductor element, with the first confronting surface of the first circuit forming surface as a contact surface, whereby said ball electrodes of said second semiconductor element and the first wirings formed at the side surface of the other semiconductor devices are at substantially same positions, and heating the second semiconductor device at a specified temperature, to connect the bump electrodes of the semiconductor devices and the wirings formed at the side surfaces of the semiconductor devices to the second semiconductor device through said ball electrodes.

9. The manufacturing method of claim 8, wherein the end surface of the wiring formed at the side surface of the semiconductor elements are sealed with the sealing resin.

\* \* \* \* \*